US011075218B2

(12) United States Patent
Inoue

(10) Patent No.: US 11,075,218 B2
(45) Date of Patent: Jul. 27, 2021

(54) METHOD OF MAKING A THREE-DIMENSIONAL MEMORY DEVICE USING SILICON NITRIDE ETCHING END POINT DETECTION

(71) Applicant: SANDISK TECHNOLOGIES LLC, Addison, TX (US)

(72) Inventor: Shigehisa Inoue, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 40 days.

(21) Appl. No.: 16/419,243

(22) Filed: May 22, 2019

(65) Prior Publication Data

US 2020/0373323 A1 Nov. 26, 2020

(51) Int. Cl.
*H01L 27/11582* (2017.01)
*H01L 27/11565* (2017.01)
(Continued)

(52) U.S. Cl.
CPC .... *H01L 27/11582* (2013.01); *H01L 21/0217* (2013.01); *H01L 21/31111* (2013.01);
(Continued)

(58) Field of Classification Search
None
See application file for complete search history.

(56) References Cited

U.S. PATENT DOCUMENTS 6,001,215 A * 12/1999 Ban ................... H01L 21/67086
156/345.15

6,699,400 B1 * 3/2004 Ballantine ......... H01L 21/31111
216/90

(Continued)

FOREIGN PATENT DOCUMENTS

EP 1729332 10/2016
JP 3813716 B2 8/2006
(Continued)

OTHER PUBLICATIONS

Notification of Transmittal of the International Search Report and Written Opinion of the International Search Authority for International Patent Application No. PCT/US2020/021525, dated Jul. 6, 2020, 10 pages.

(Continued)

*Primary Examiner* — Nilufa Rahim
(74) *Attorney, Agent, or Firm* — The Marbury Law Group PLLC

(57) ABSTRACT

A method of making three-dimensional memory device includes forming a stack of insulating layers and silicon nitride sacrificial layers over a substrate, forming memory stack structures in the alternating stack, forming a trench through the alternating stack, selectively etching the silicon nitride sacrificial layers through the trench using a phosphoric acid solution, filling a sample container with a fixed quantity of the phosphoric acid solution that was used to etch the silicon nitride sacrificial layers, determining a weight of the sample container, determining if a threshold value indicative of the etching end point has been reached or exceeded based on the determined weight, stopping the etching of the silicon nitride sacrificial layers in response to determining that the threshold value indicative of the etching end point has been reached or exceeded to leave recesses between the insulating layers, and filling the recesses with electrically conductive layers.

12 Claims, 28 Drawing Sheets

(51) Int. Cl.
  *H01L 27/1157* (2017.01)
  *H01L 21/67* (2006.01)
  *H01L 21/02* (2006.01)
  *H01L 21/311* (2006.01)
  *H01L 21/28* (2006.01)
  *H01L 27/11524* (2017.01)
  *H01L 27/11556* (2017.01)
  *H01L 27/11519* (2017.01)

(52) U.S. Cl.
  CPC .... *H01L 21/67075* (2013.01); *H01L 27/1157* (2013.01); *H01L 27/11565* (2013.01); *H01L 29/40117* (2019.08); *H01L 27/11519* (2013.01); *H01L 27/11524* (2013.01); *H01L 27/11556* (2013.01)

(56) References Cited

U.S. PATENT DOCUMENTS

| | | | |
|---|---|---|---|
| 8,409,997 B2 * | 4/2013 | Wei | H01L 21/31111 438/745 |
| 9,718,710 B2 | 8/2017 | Hirakawa et al. | |
| 10,103,169 B1 | 10/2018 | Ge et al. | |
| 10,209,636 B1 | 2/2019 | Toda et al. | |
| 2005/0067101 A1 * | 3/2005 | Funabashi | H01L 21/67109 156/345.18 |
| 2012/0247505 A1 * | 10/2012 | Brown | H01L 21/67086 134/3 |
| 2014/0011367 A1 | 1/2014 | Nowling et al. | |
| 2017/0276582 A1 | 9/2017 | Hadd et al. | |
| 2019/0074188 A1 * | 3/2019 | Cooper | C30B 33/10 |

FOREIGN PATENT DOCUMENTS

| | | |
|---|---|---|
| JP | 5003047 B2 | 8/2012 |
| JP | 5447649 B2 | 3/2014 |
| KR | 10-2006-0007229 A | 1/2006 |
| KR | 10-2006-0126990 A | 12/2006 |
| WO | WO2018-004749 A1 | 1/2018 |

OTHER PUBLICATIONS

Endoh et al., "Novel Ultra High Density Memory with a Stacked-Surrounding Gate Transistor (S-SGT) Structured Cell," IEDM Proc. (2001) 33-36.

* cited by examiner

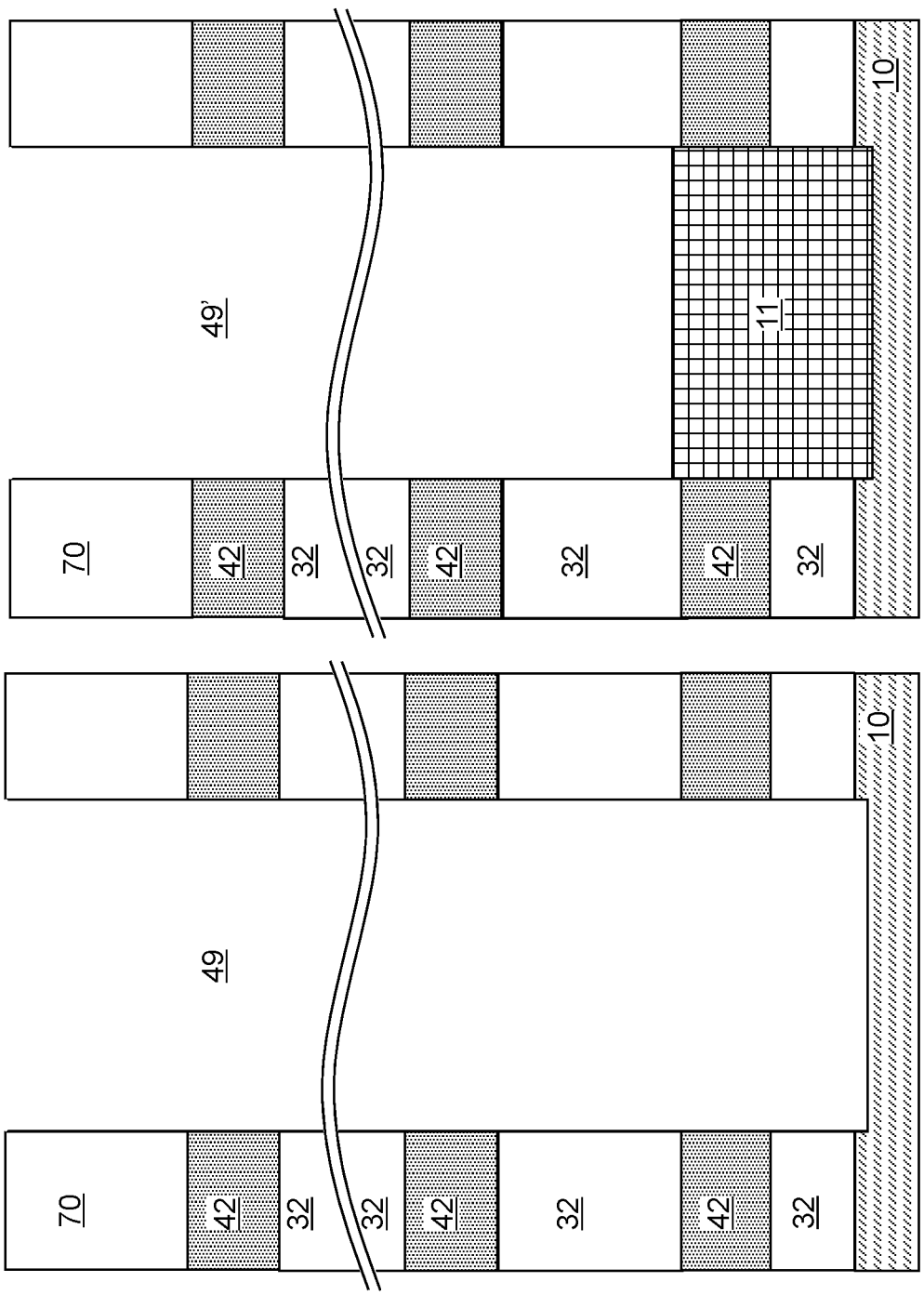

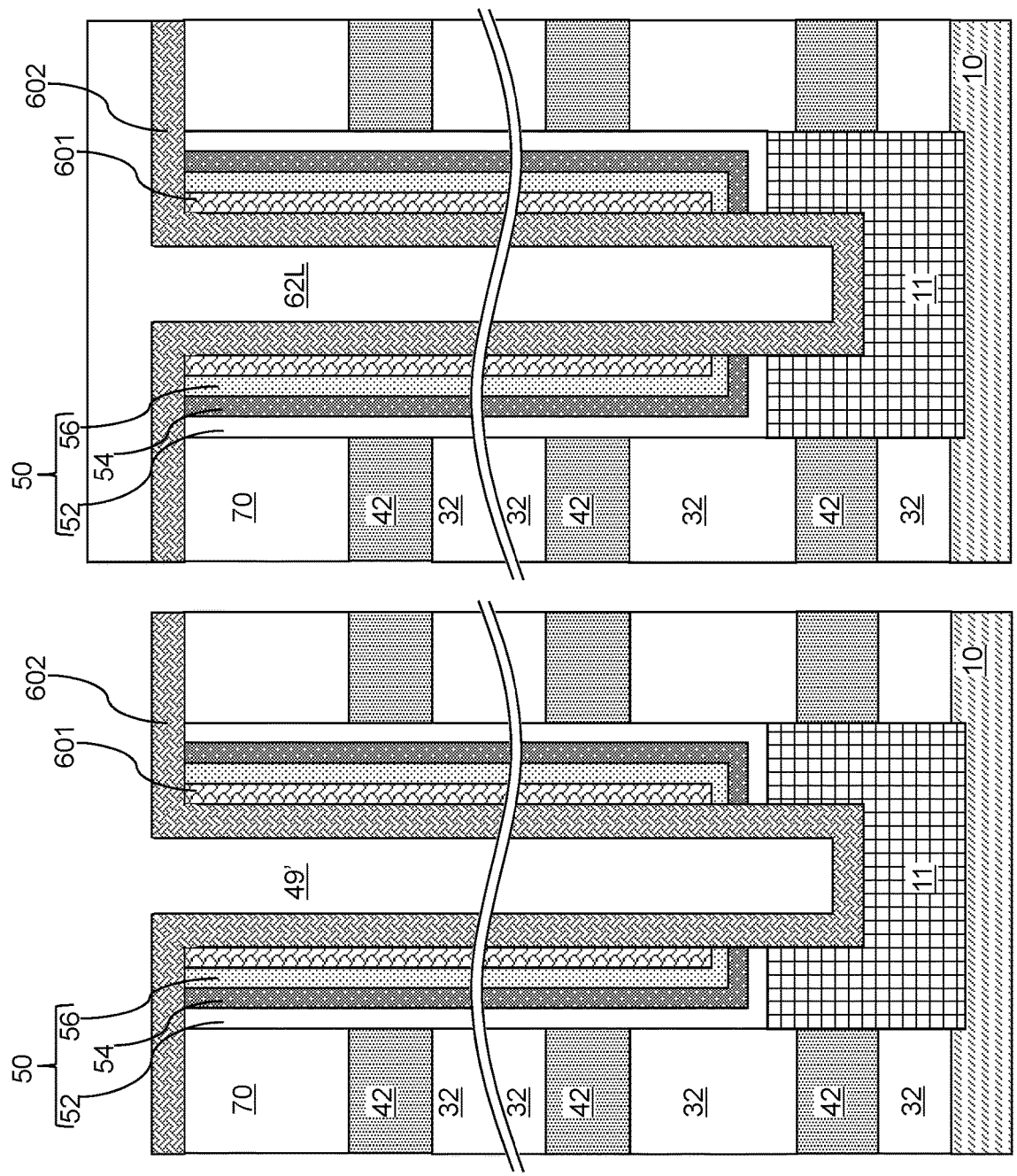

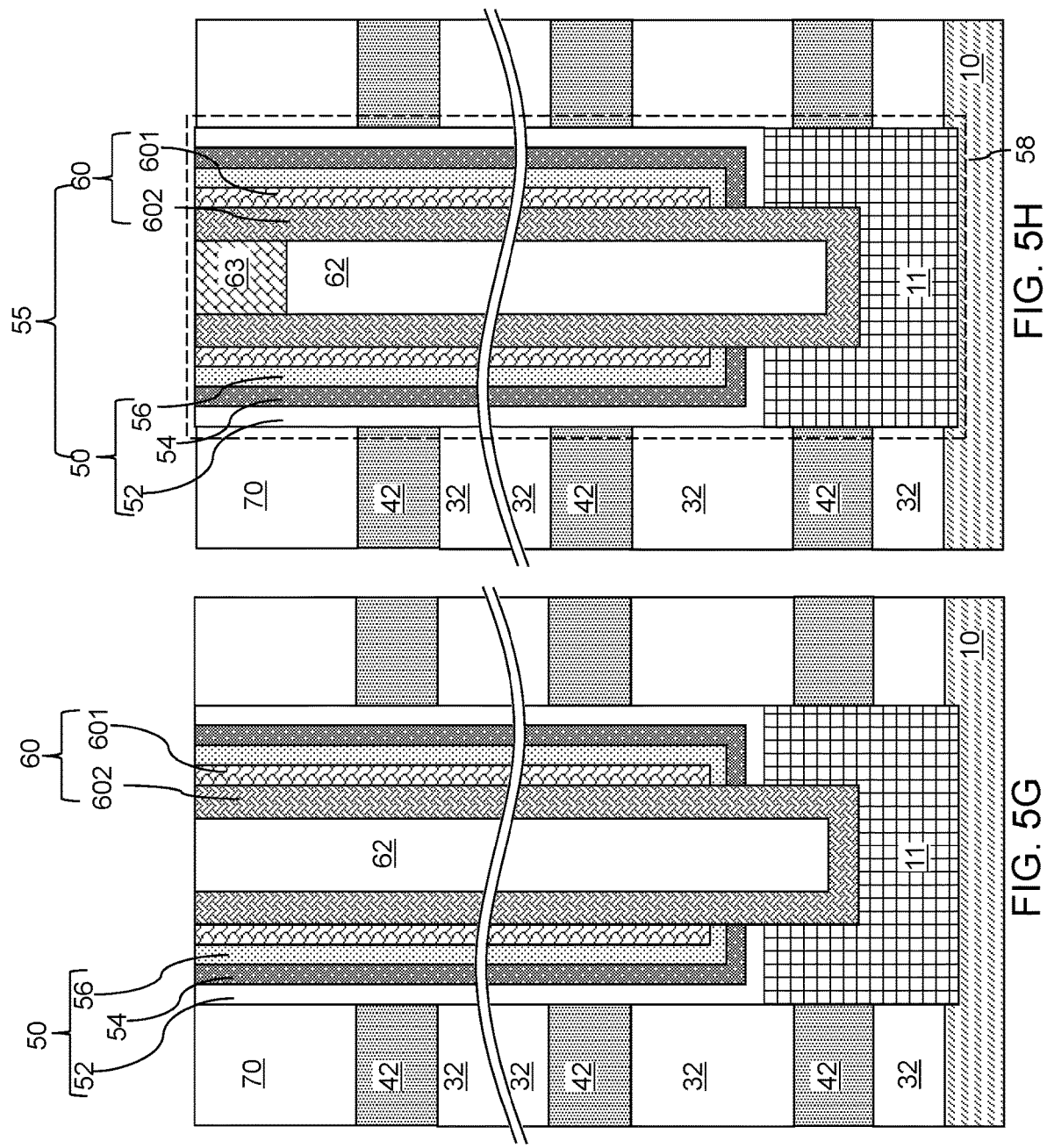

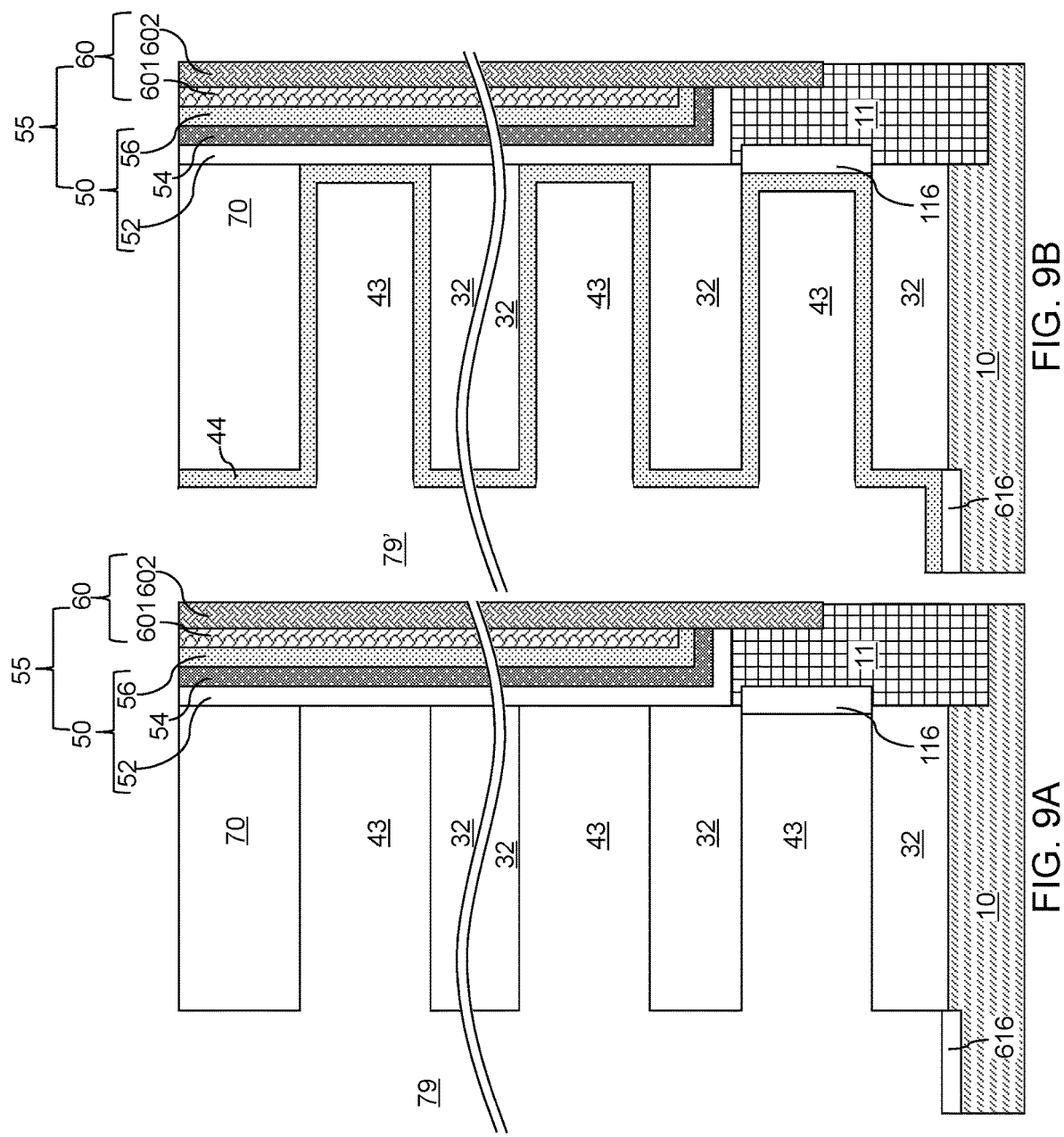

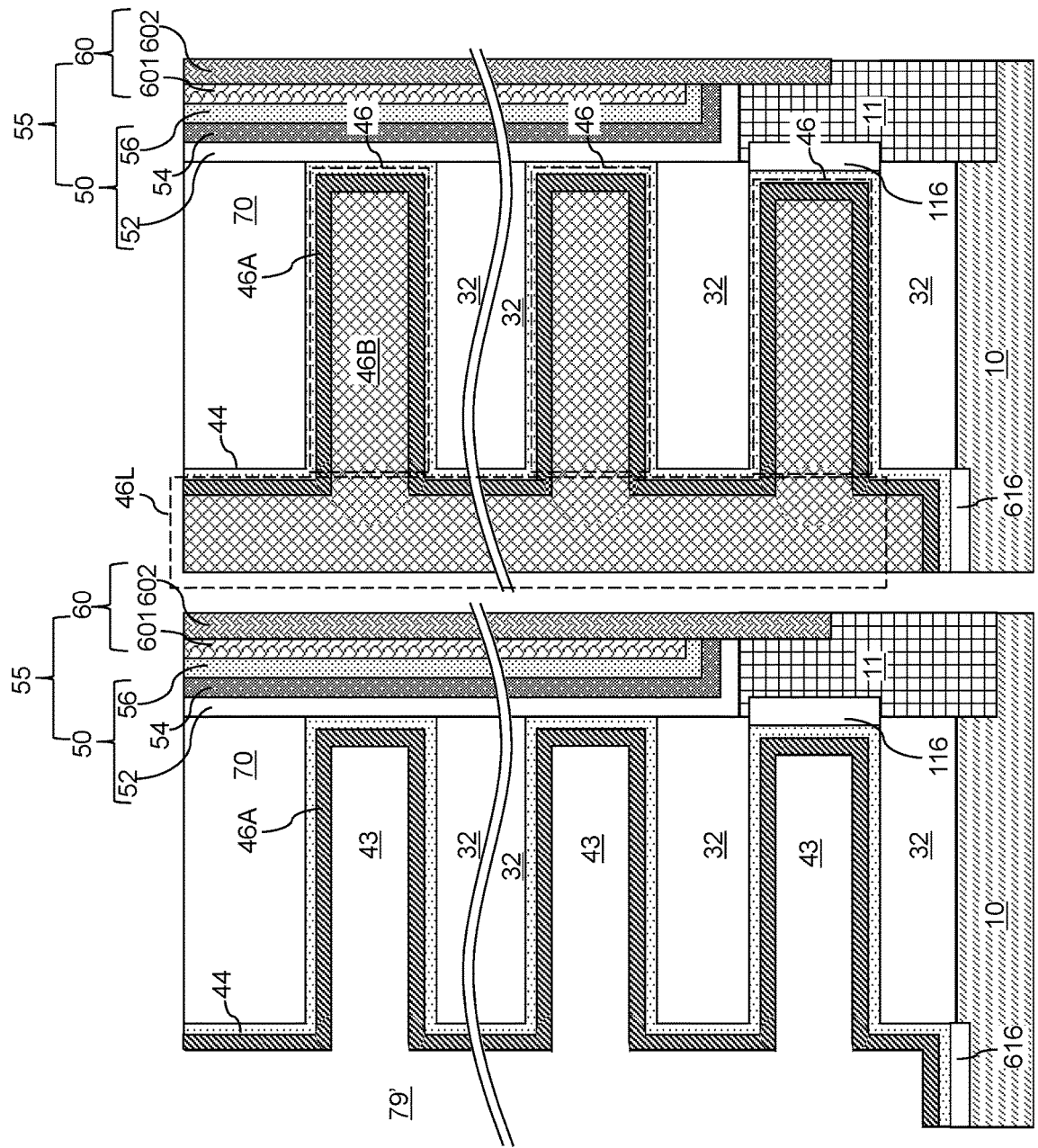

METHOD OF MAKING A THREE-DIMENSIONAL MEMORY DEVICE USING SILICON NITRIDE ETCHING END POINT DETECTION

FIELD

The present disclosure relates generally to the field of semiconductor devices, and more particularly to methods of making three-dimensional memory devices using silicon nitride etching end point detection.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of making three-dimensional memory device includes forming a stack of insulating layers and silicon nitride sacrificial layers over a substrate, forming memory stack structures in the alternating stack, forming a trench through the alternating stack, selectively etching the silicon nitride sacrificial layers through the trench using a phosphoric acid solution, filling a sample container with a fixed quantity of the phosphoric acid solution that was used to etch the silicon nitride sacrificial layers, determining a weight of the sample container, determining if a threshold value indicative of the etching end point has been reached or exceeded based on the determined weight, stopping the etching of the silicon nitride sacrificial layers in response to determining that the threshold value indicative of the etching end point has been reached or exceeded to leave recesses between the insulating layers, and filling the recesses with electrically conductive layers.

According to an aspect of the present disclosure, a method of making a device includes etching a silicon nitride layer using phosphoric acid solution, filling a sample container with a fixed quantity of the phosphoric acid solution that was used to etch the silicon nitride layer, determining a weight of the sample container containing the fixed quantity of phosphoric acid solution, determining if a threshold value indicative of the etching end point has been reached or exceeded based on the determined weight, and stopping the etching of the silicon nitride layer in response to determining that the threshold value indicative of the etching end point has been reached or exceeded.

According to an aspect of the present disclosure, a phosphoric acid wet etching system includes an etch tank, a sample line configured to fill a sample container with a fixed quantity of phosphoric acid solution being used to etch a silicon nitride layer in the etch tank, a scale configured to a determine a weight of the sample container containing the fixed quantity of phosphoric acid, and a controller connected to the scale. The controller is configured to determine if a threshold value indicative of the etching end point has been reached or exceeded based on the determined weight, and stop the etching of the silicon nitride layer in response to determining that the threshold value indicative of the etching end point has been reached or exceeded.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

DETAILED DESCRIPTION

Figure 1:
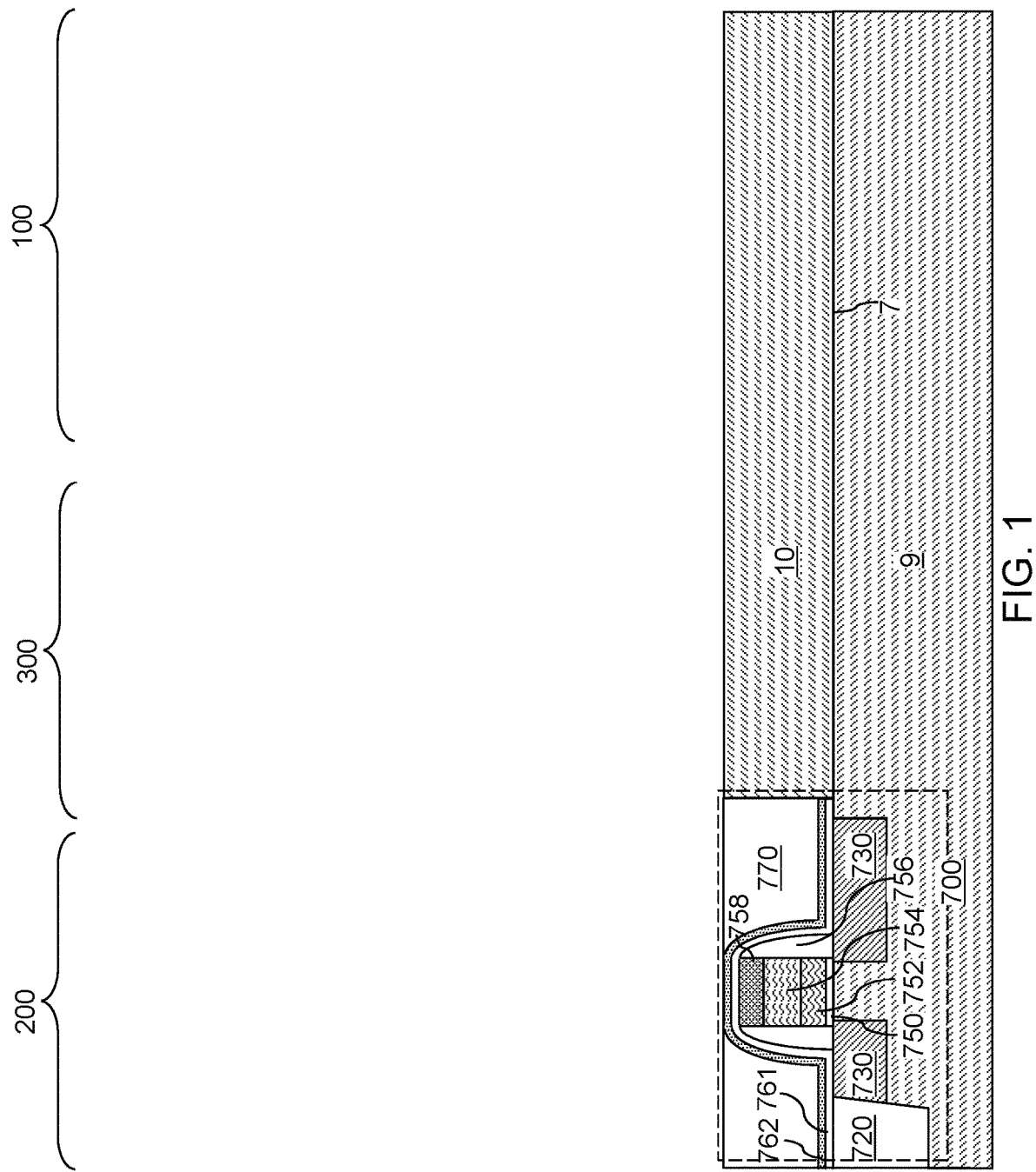
FIG. 1 is a schematic vertical cross-sectional view of an exemplary structure after formation of at least one peripheral device, and a semiconductor material layer according to an embodiment of the present disclosure.

Silicon nitride layers may be used as sacrificial material layers within alternating stacks of insulating layers and sacrificial material layers during manufacturing of a three-dimensional memory device, such as a three-dimensional NAND memory device. In various steps of manufacturing three-dimensional memory devices, the silicon nitride layers may be removed, such as by selective wet etching processes. For example, a wet etch process using phosphoric acid ($H_3PO_4$) and water, such as deionized water, solution (e.g., 85 wt. % phosphoric acid and 15 wt. % deionized water) may be used to remove silicon nitride layers. The phosphoric acid may be heated to a temperature above room temperature, such as 140° C. to 180° C. to etch silicon nitride and is referred to as "hot" phosphoric acid. Phosphoric acid is often used to etch silicon nitride films because of its selectivity for etching silicon nitride over silicon oxide and etching rate for silicon nitride. In such a phosphoric acid wet etch process, the etching mechanism of the silicon nitride by the phosphoric acid may be described by the following reactions: $Si_3N_4 + 12H_2O \rightarrow 3Si(OH)_4 + 4NH_4\uparrow$ and $SiO_2 + 2H_2O \leftrightarrow Si(OH)_4$. In a phosphoric acid wet etch process, the three-dimensional memory device including the sacrificial silicon nitride layers may be inserted in a tank of phosphoric acid, the phosphoric acid may be heated and circulated through the tank and over the three-dimensional memory device to selectively etch away the sacrificial silicon nitride layers. The phosphoric acid wet etch process may be controlled to stop the etching at a desired etch point. A goal in any etch process, especially a phosphoric acid wet etch process, may be to avoid over etching (i.e., removing more material than desired, such as removing a non-sacrificial material, such as the blocking dielectric as will be described below).

One method for controlling a phosphoric acid wet etch process includes sampling the phosphoric acid in a circulation line providing phosphoric acid to the tank, allowing the sample to cool to 150-165 degrees Celsius (° C.), adding a silicate reagent to the sample collected that reacts with the silica in the sample, measuring the quantity of the non-reaction silicate reagent in the sample, and calculating the silicon concentration in the sample based on the quantity of the non-reaction silicate reagent measured. The phosphoric acid wet etch process can be stopped when the silicon concentration is determined by a densimeter (i.e., a density meter) to be at or above a threshold value. While such a method does impart some control to a phosphoric acid wet etch process, the method provides a lower than desired accuracy as to the point at which to stop etching (i.e., etching end point detection) because of the time needed for the sample to cool to 150-165° C. and the time needed for the reaction between the silica and reagent can take several minutes, such as 7 to 10 minutes, thereby allowing etching to potentially occur beyond a desired etching end point. Also, the method provides lower than desired accuracy because it provides an indirect silicon concentration measurement by the non-reaction reagent which may have a large error ratio of over 10%. The low accuracy of the method may result in an over etching of the three-dimensional memory device by 30% (e.g., over etching of the exposed blocking dielectric described below).

Embodiments of the present disclosure are directed controlling the end point detection of a silicon nitride wet etching process using phosphoric acid wet etch process by measuring the weight of silicon in the circulating phosphoric acid solution and determining the end point of the etching based on the measured weight to increase measurement precision and reduce the measurement time. Embodiments of the present disclosure are directed to measuring the weight of a known quantity sample of phosphoric acid in a circulation line providing phosphoric acid and determining the silicon concentration based on the weight of the sample. The silicon concentration being at or above a threshold may indicate a desired etch end point has been reached and, in response, etching may be ceased. The embodiments of the present disclosure are directed to direct measurement methods to detect a desired etch end point. The embodiments of the present disclosure may provide a process with a repeatability of +/−0.1 parts per million (ppm) and error rate of less than 1%, such as 0.2% to 0.3%. The embodiments of the present disclosure may provide a process with a measurement interval time of about 30 to 60 seconds.

The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
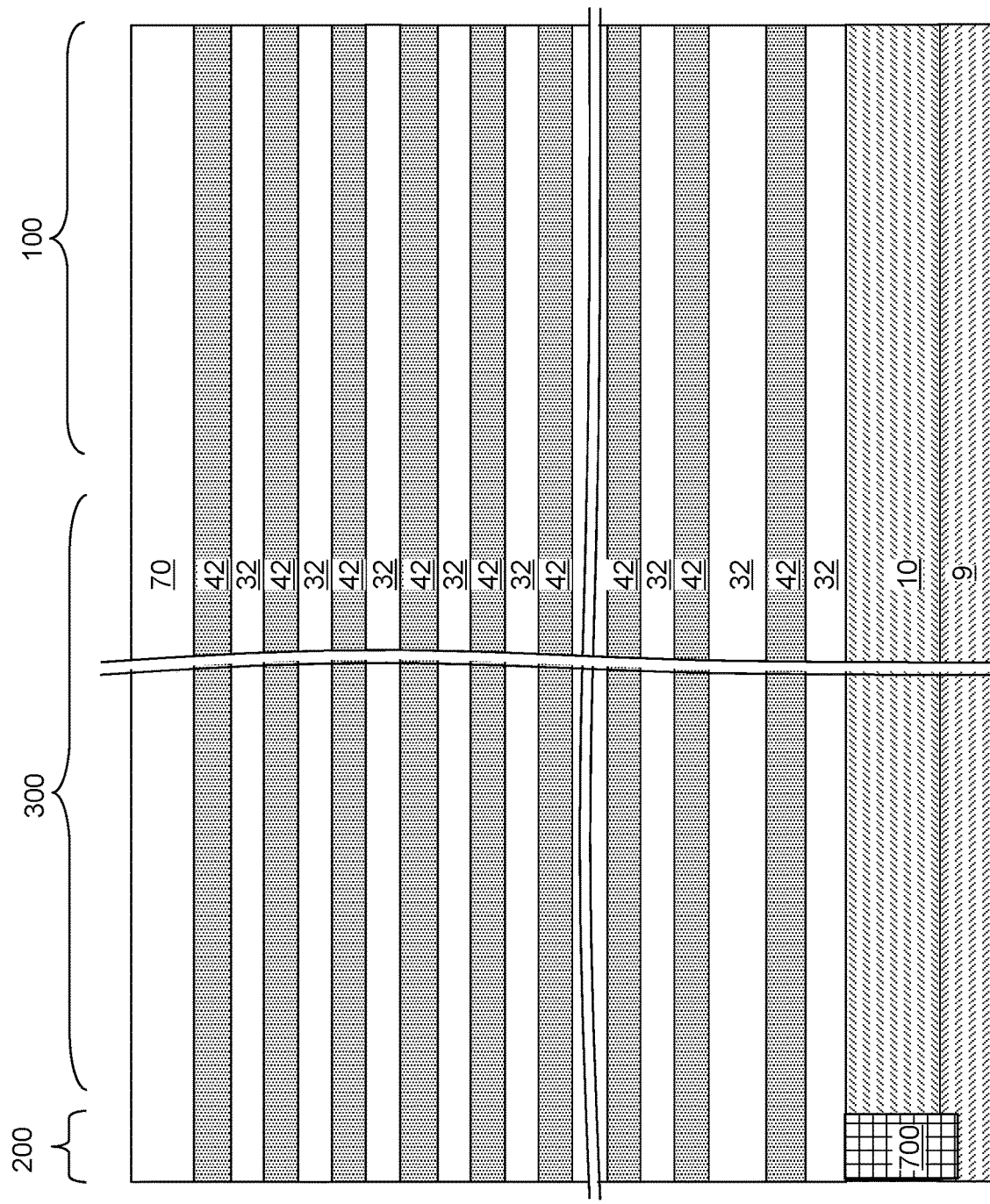
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
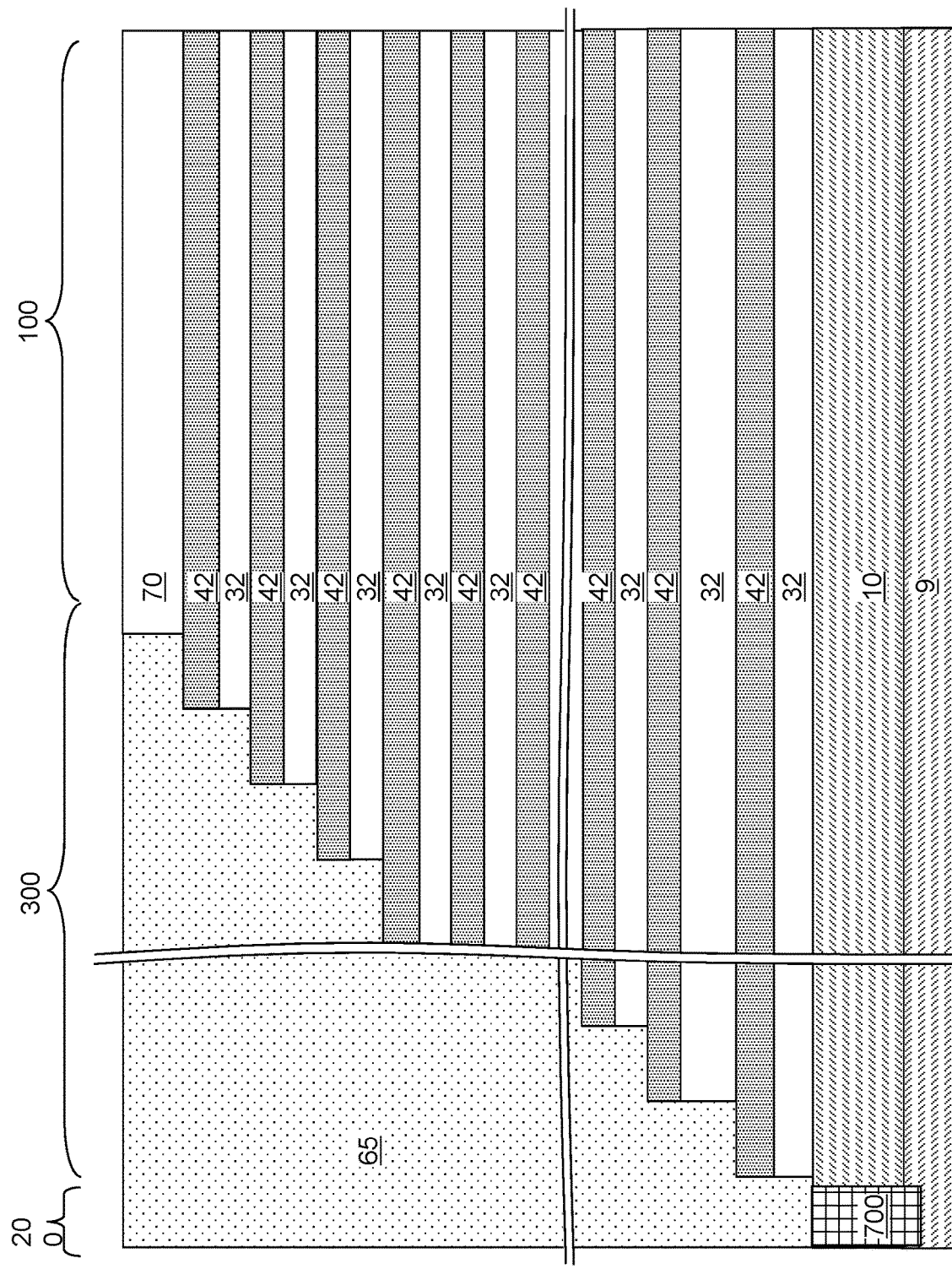
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
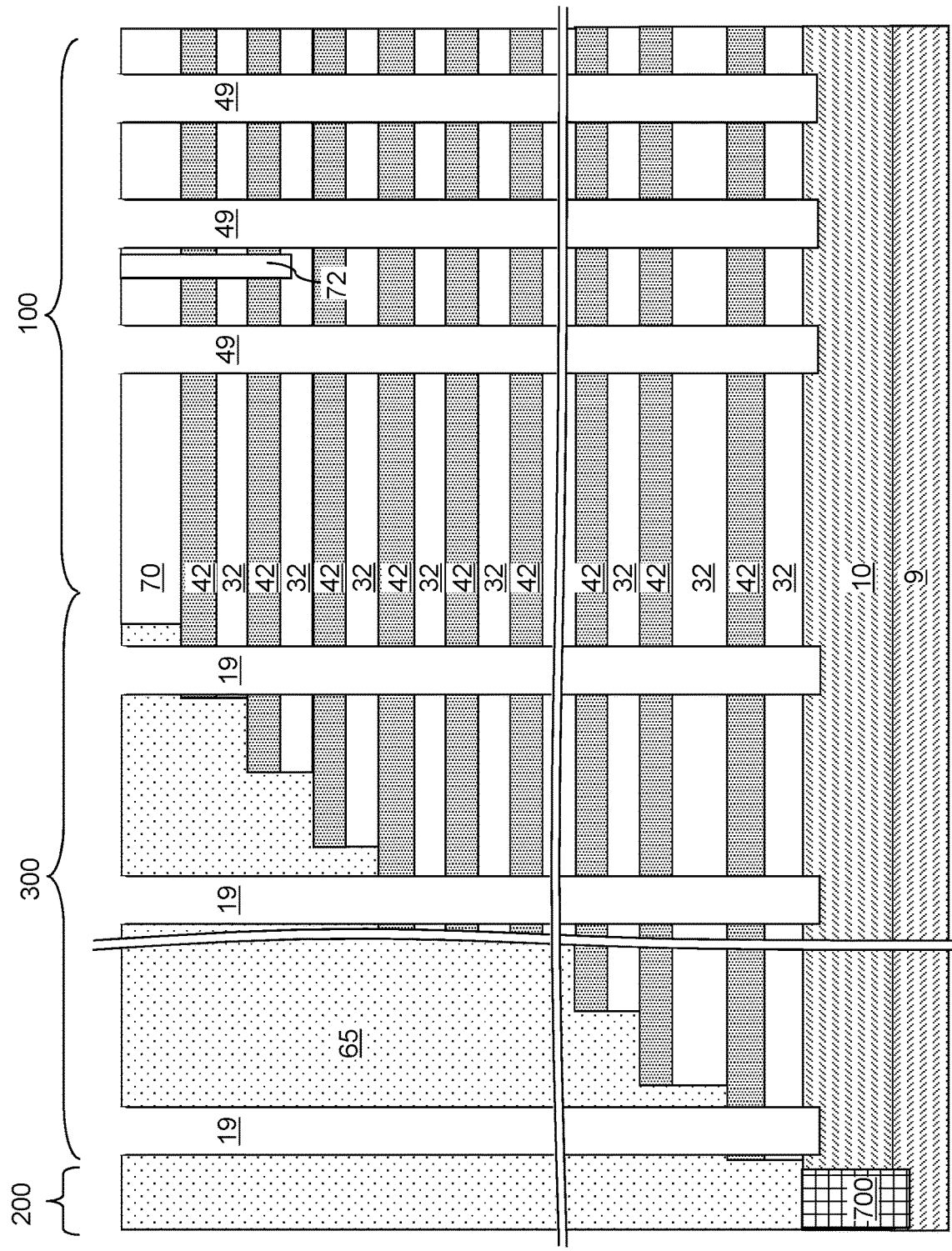
FIG. 4A is a schematic vertical cross-sectional view of the exemplary structure after formation of memory openings and support openings according to an embodiment of the present disclosure.
Figure 4B:
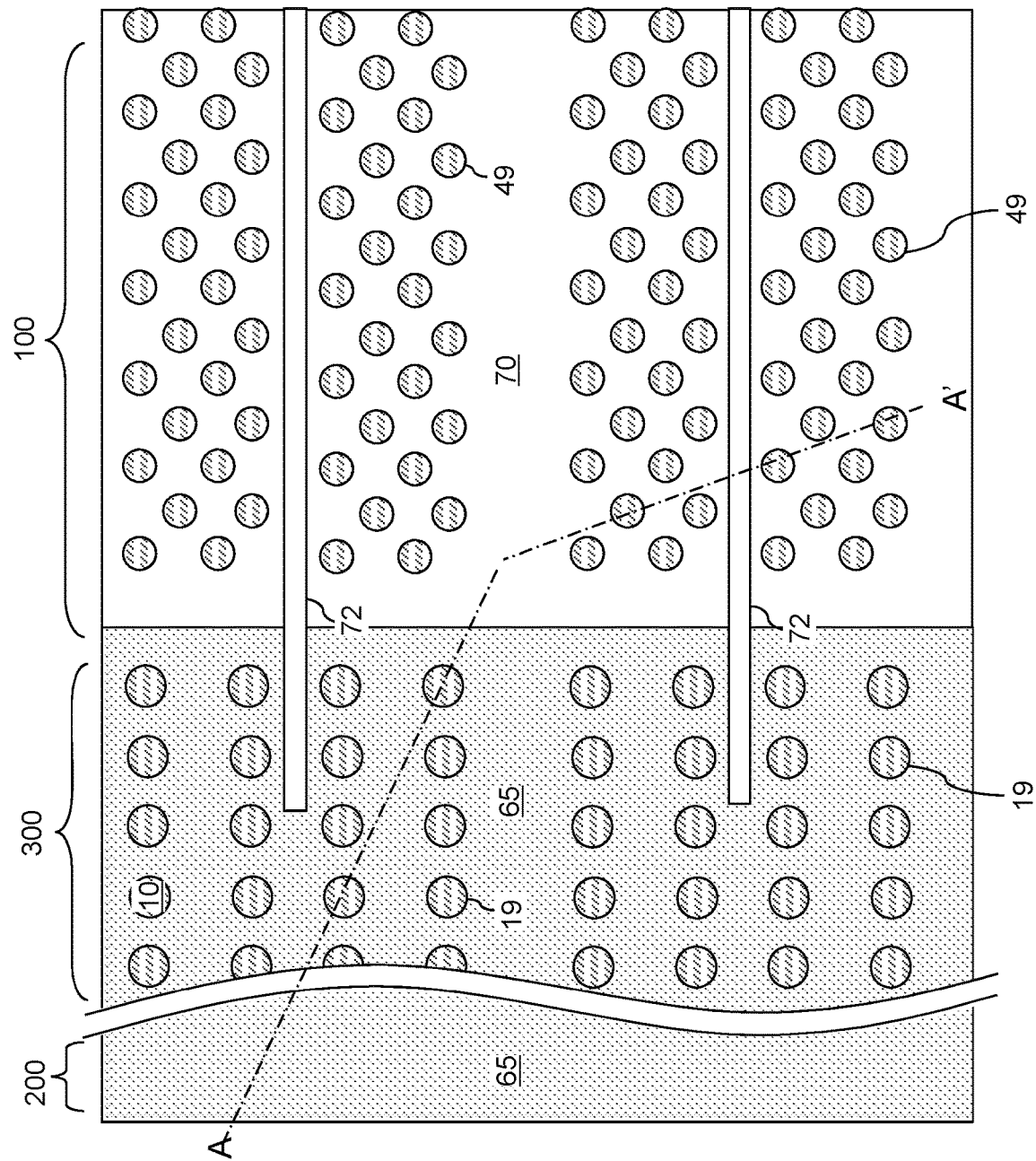
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figures 5C, 5D:
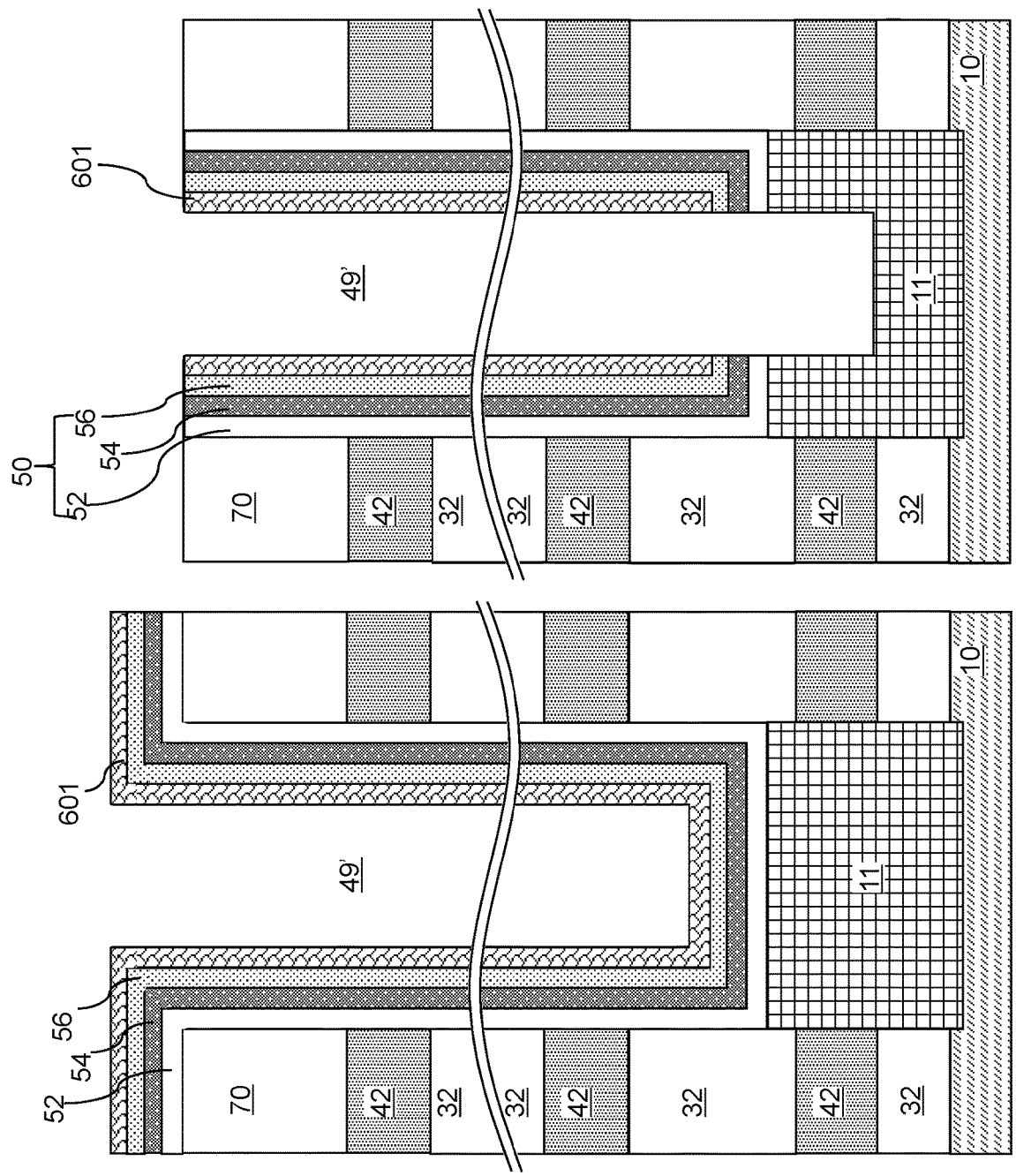

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
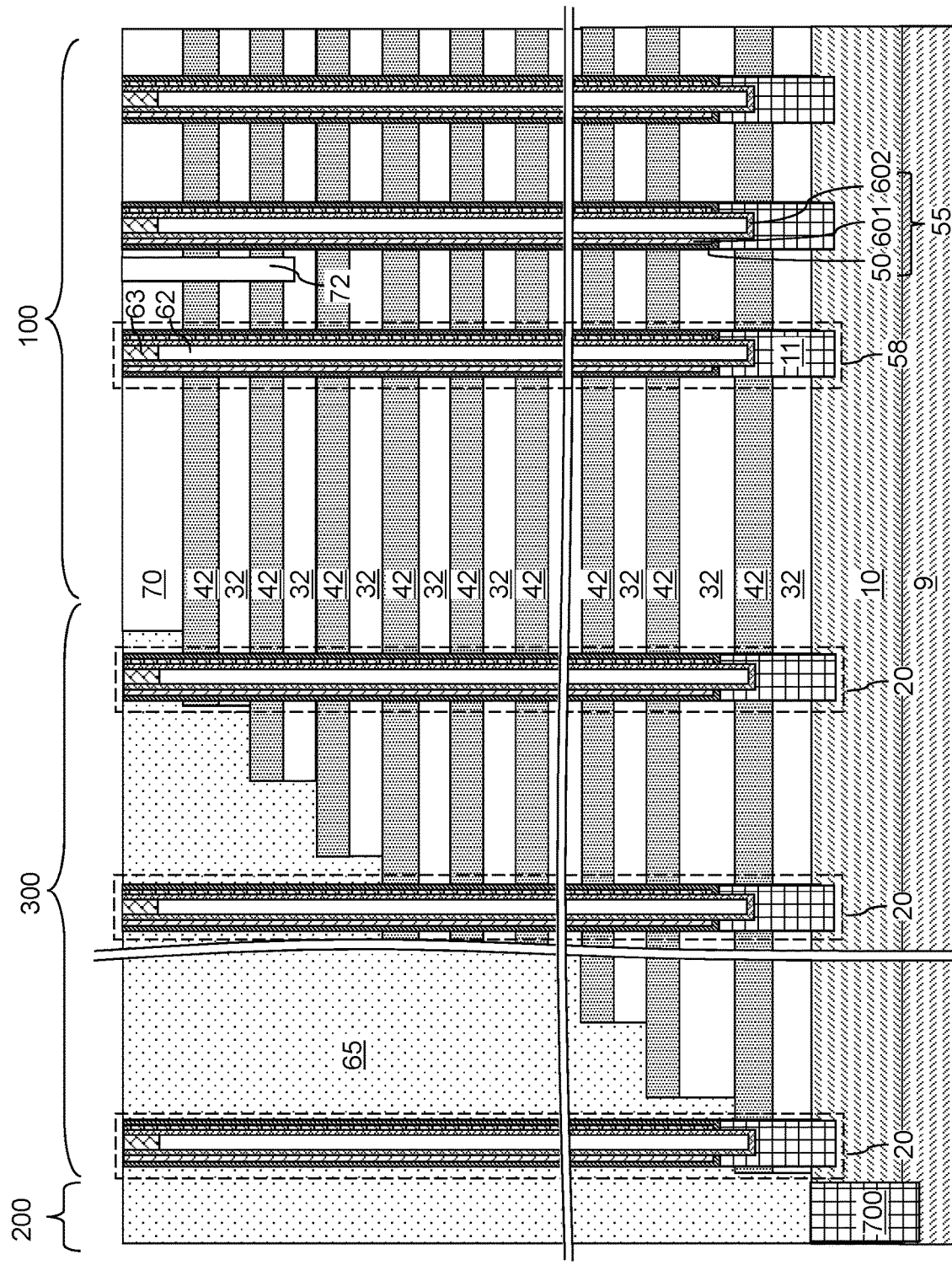
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (as embodied as a charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
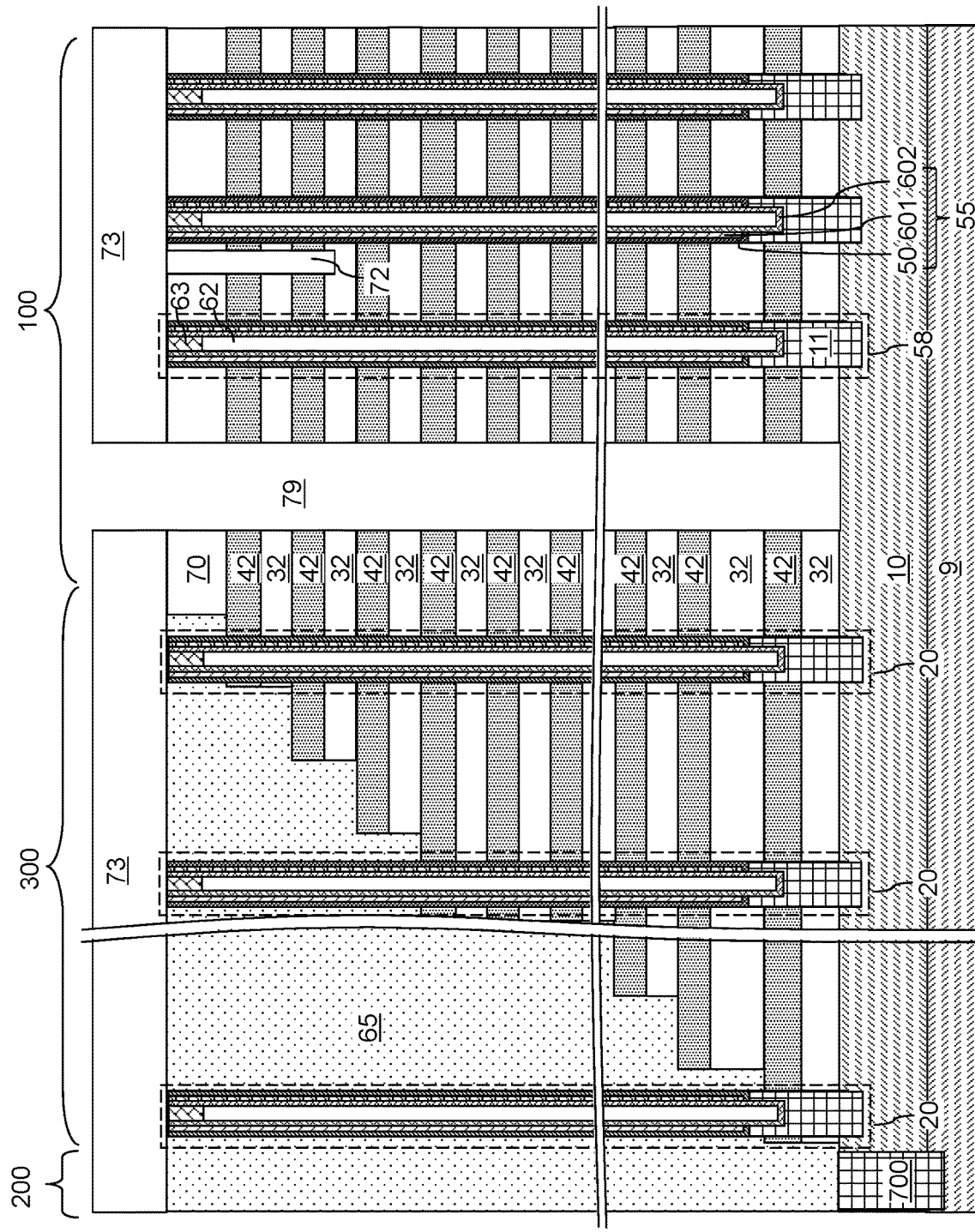
FIG. 7A is a schematic vertical cross-sectional view of the exemplary structure after formation of backside trenches according to an embodiment of the present disclosure.
Figure 7B:
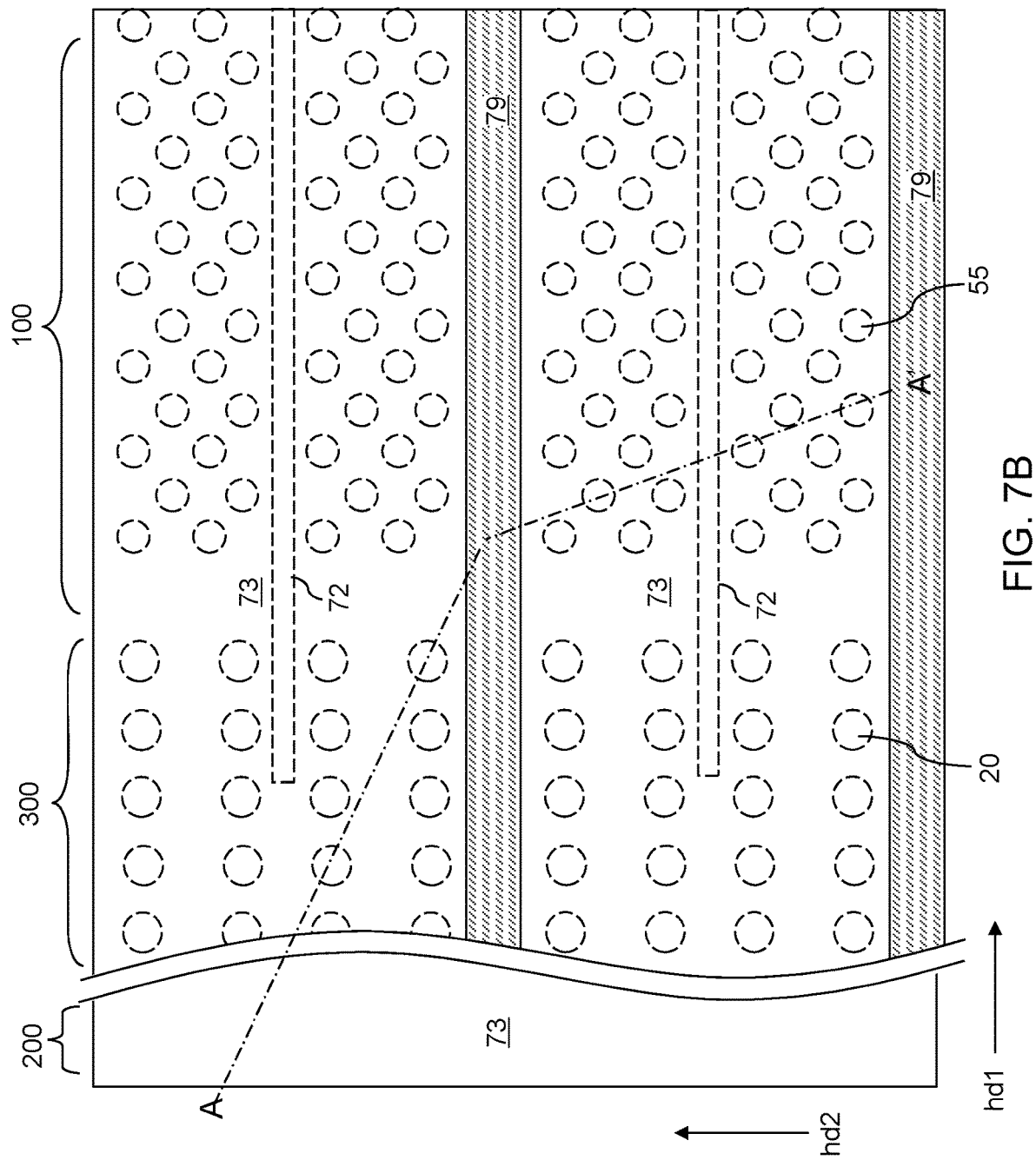
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
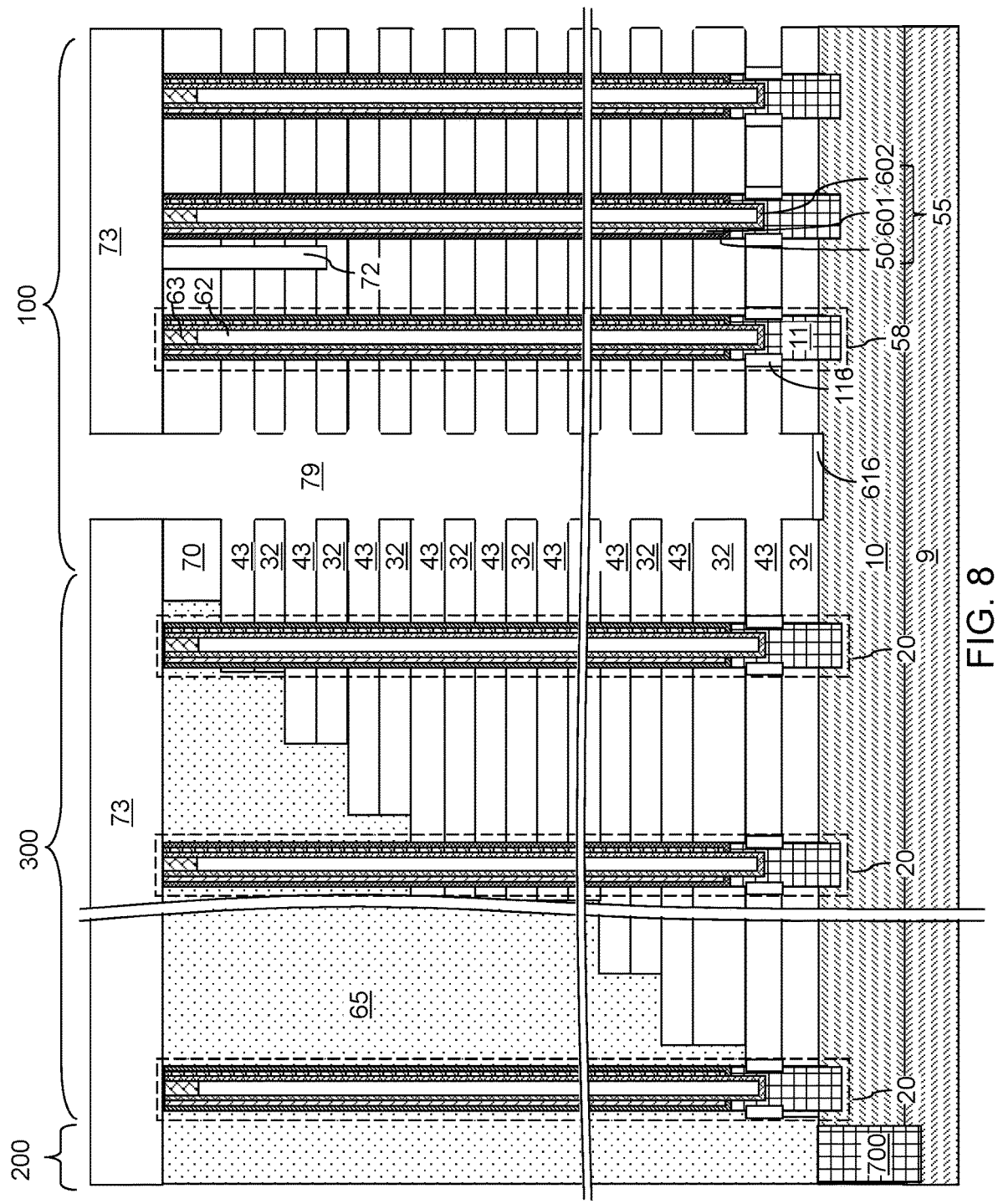
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
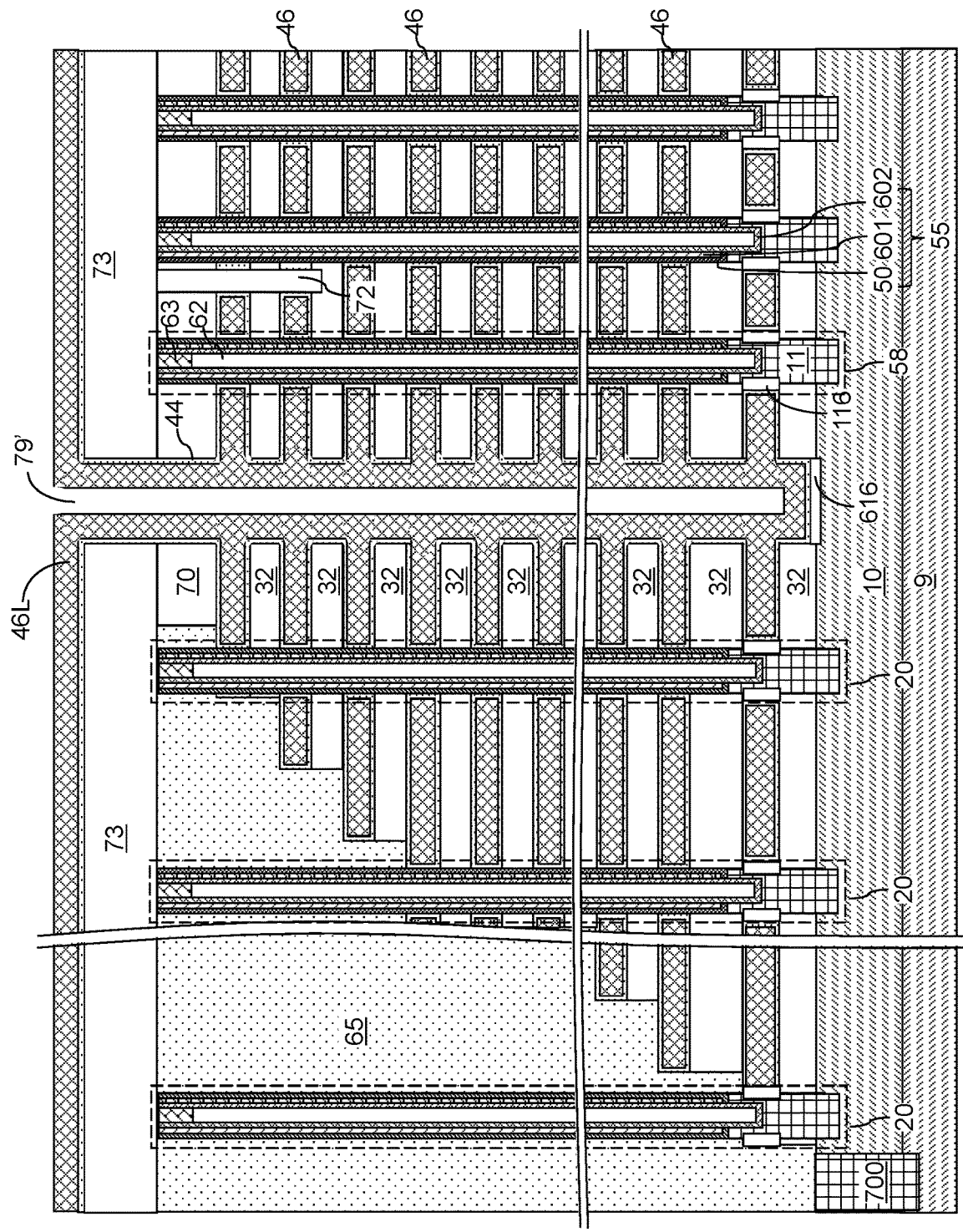
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
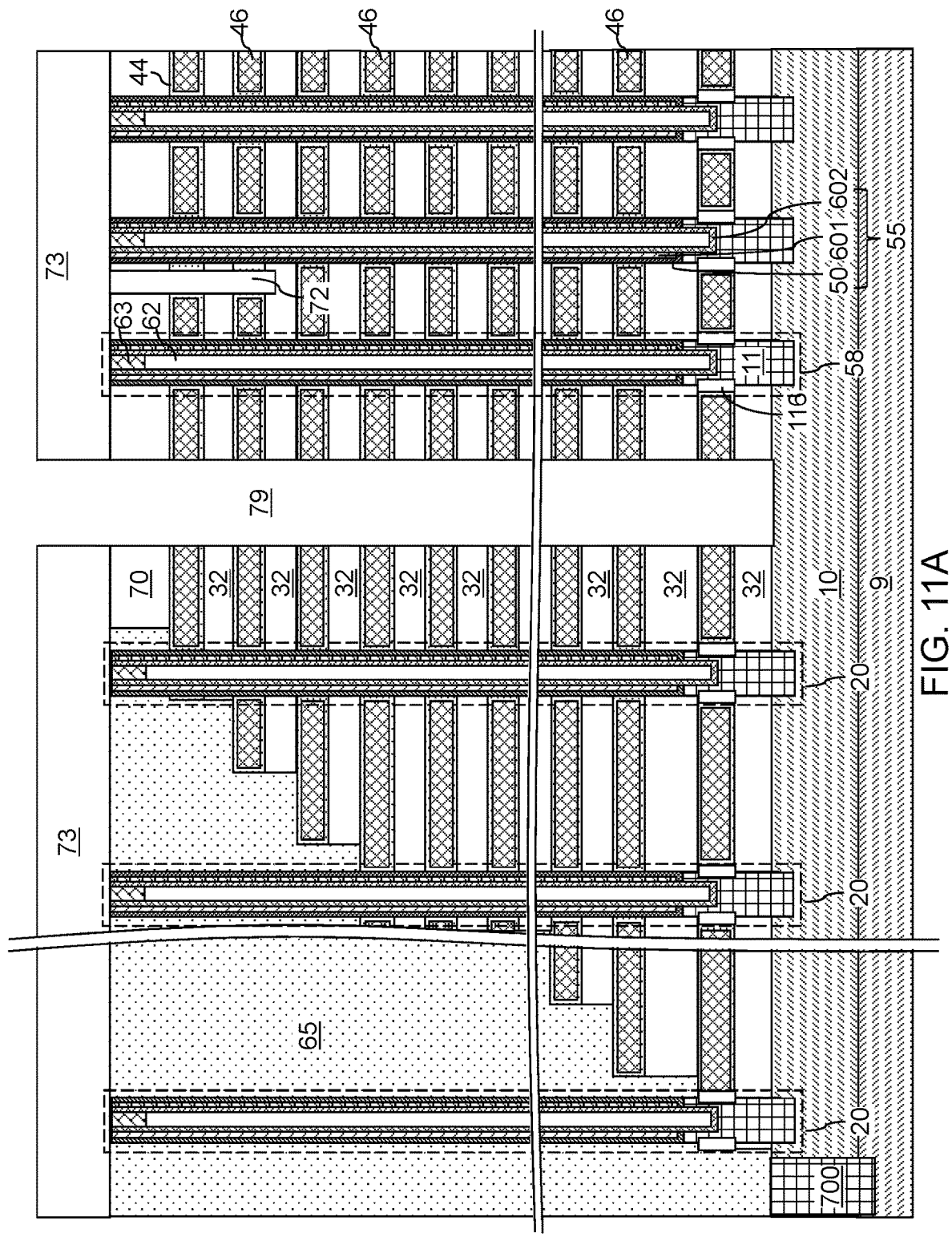
FIG. 11A is a schematic vertical cross-sectional view of the exemplary structure after removal of a deposited conductive material from within the backside trench according to an embodiment of the present disclosure.
Figure 11B:
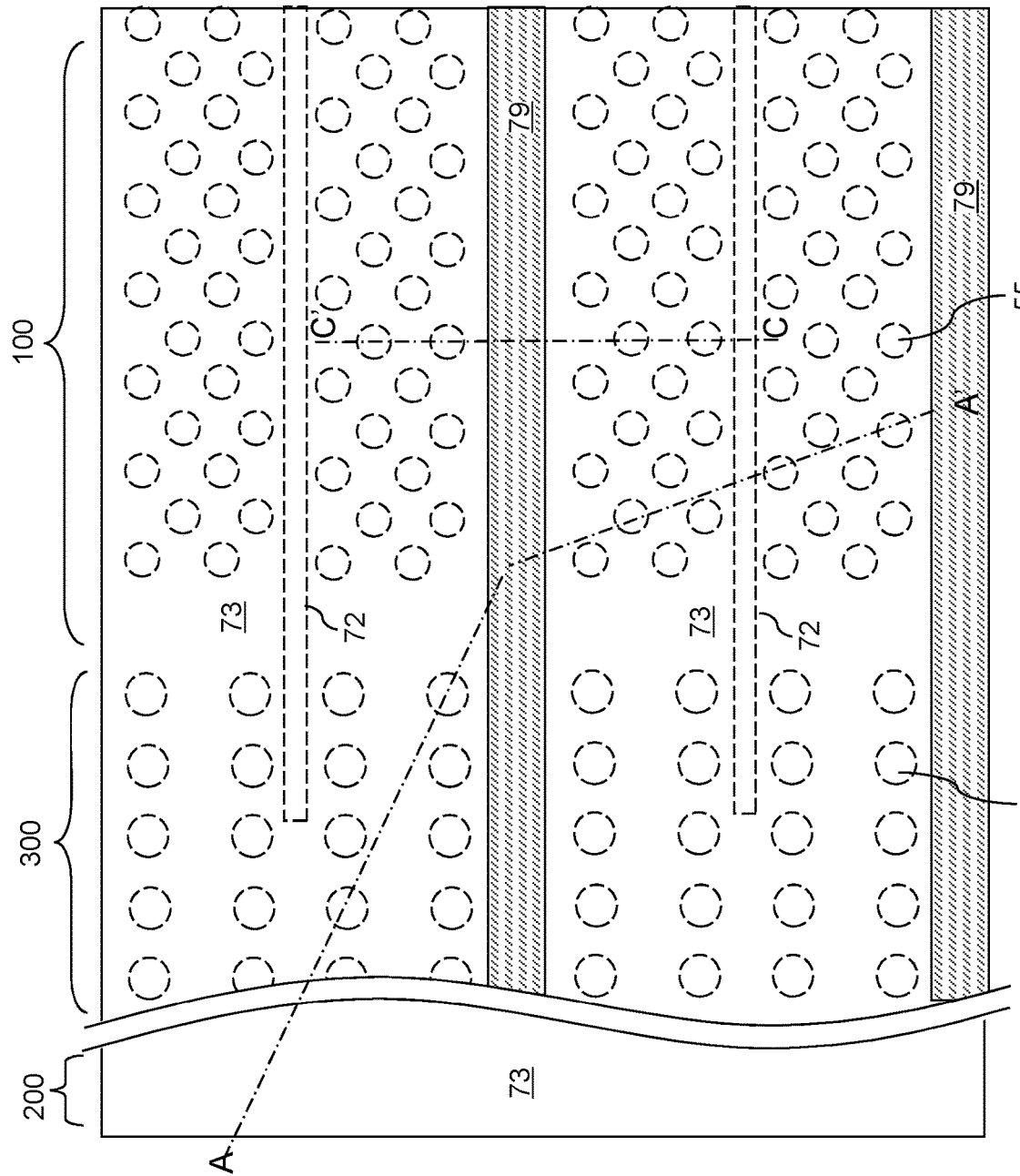
FIG. 11B is a partial see-through top-down view of the exemplary structure of FIG. 11A. The vertical plane A-A' is the plane of the schematic vertical cross-sectional view of FIG. 11A.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 12A:
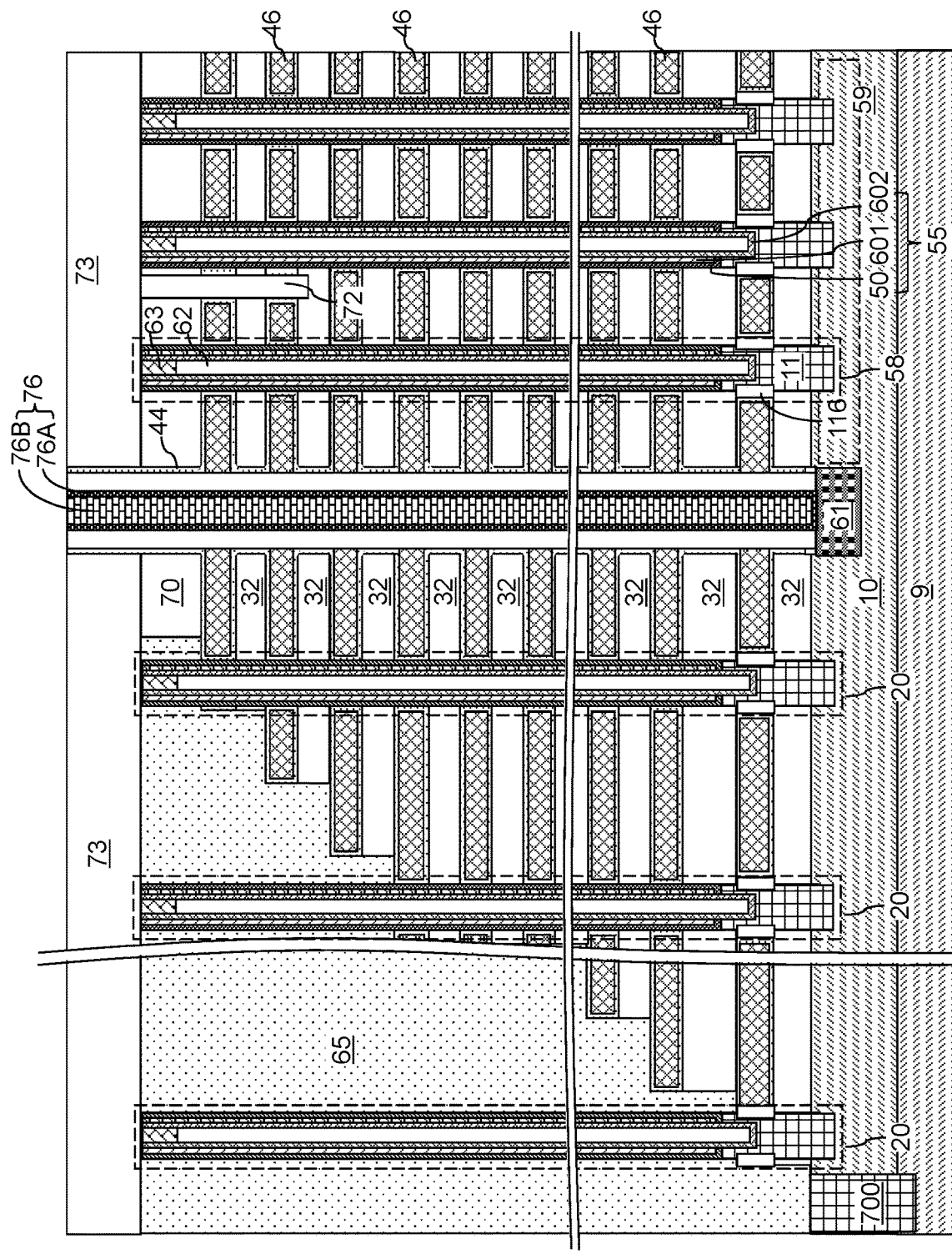
FIG. 12A is a schematic vertical cross-sectional view of the exemplary structure after formation of an insulating spacer and a backside contact structure according to an embodiment of the present disclosure.
Figure 12B:
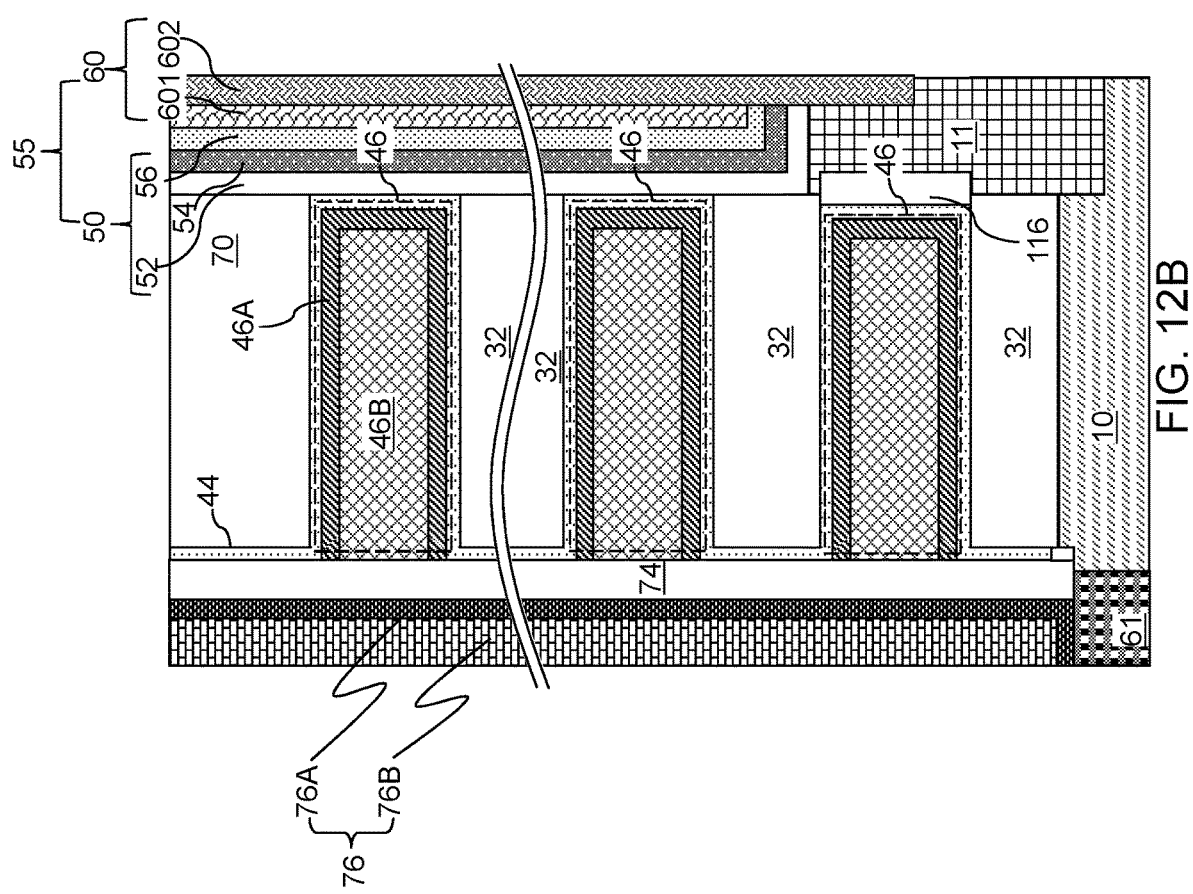
FIG. 12B is a magnified view of a region of the exemplary structure of FIG. 12A.

Referring to FIGS. 12A and 12B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
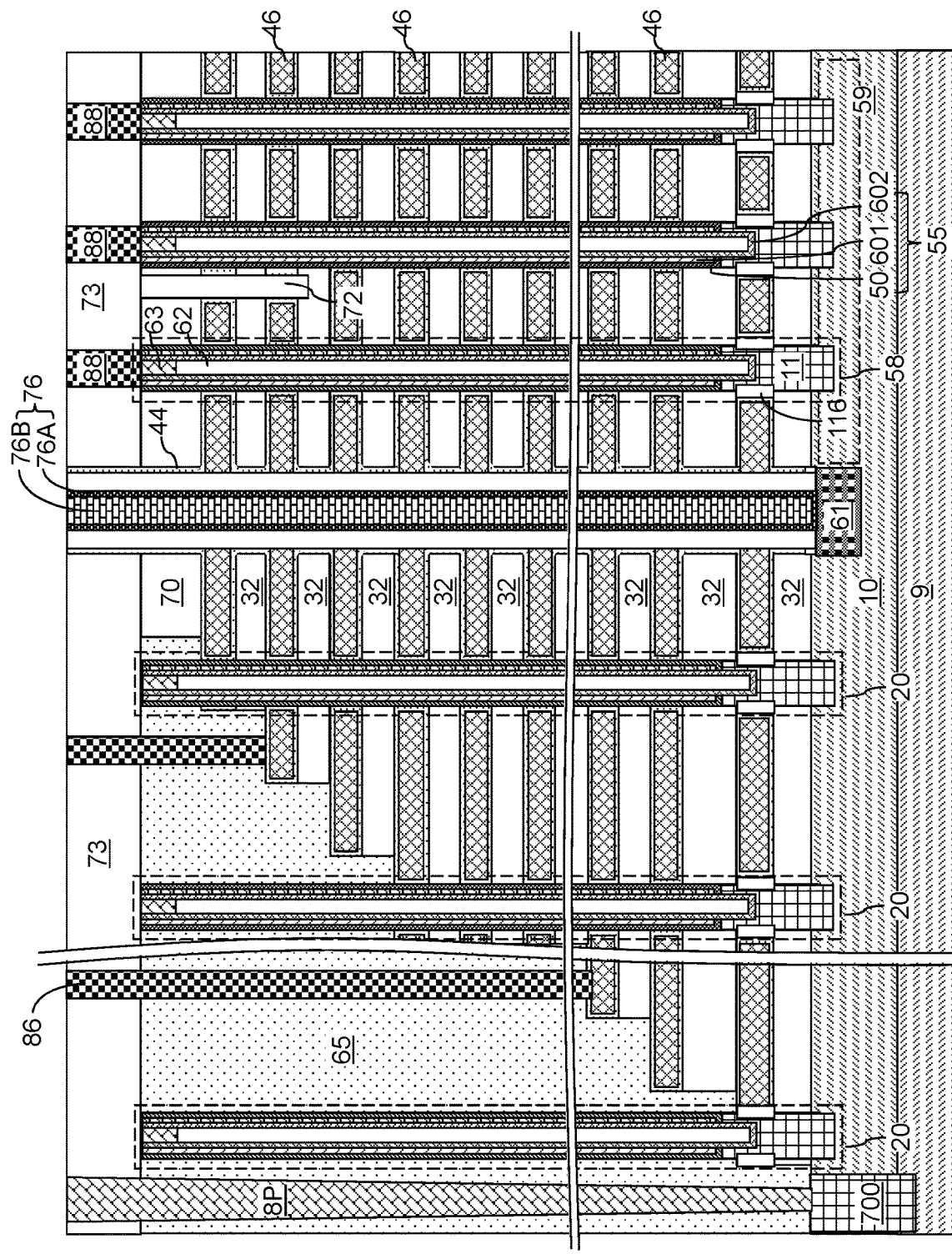
FIG. 13A is a schematic vertical cross-sectional view of the exemplary structure after formation of additional contact via structures according to an embodiment of the present disclosure.
Figure 13B:
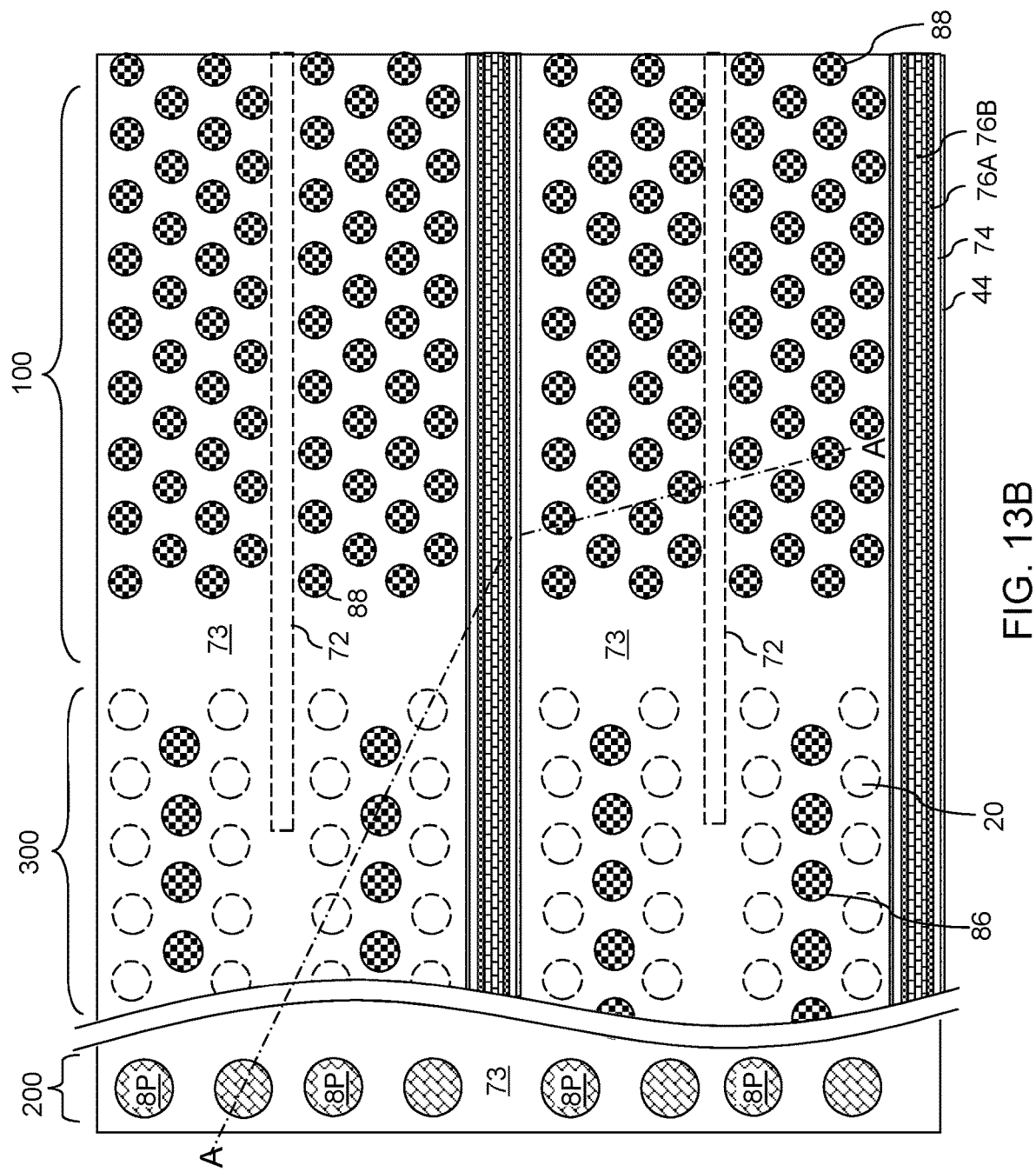
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

As discussed above with respect to FIGS. 8 and 9A, a wet etch process using hot phosphoric acid ($H_3PO_4$) may be used to remove silicon nitride layers, such as sacrificial material layers 42, selective to the silicon oxide insulating layers 32 and selective to the exposed blocking dielectric 52 exposed in the backside recesses 43 after the silicon nitride sacrificial material layers 42 are removed. The phosphoric acid wet etch process may be controlled to stop the etching at a desired (or selected) end point. The desired end point is typically when the silicon nitride sacrificial materials layers 42 are completely removed without substantially removing the blocking dielectric 52 exposed in the backside recesses 43 (e.g., without removing the exposed outer portions of the memory opening fill structures 58).

Figure 14A:
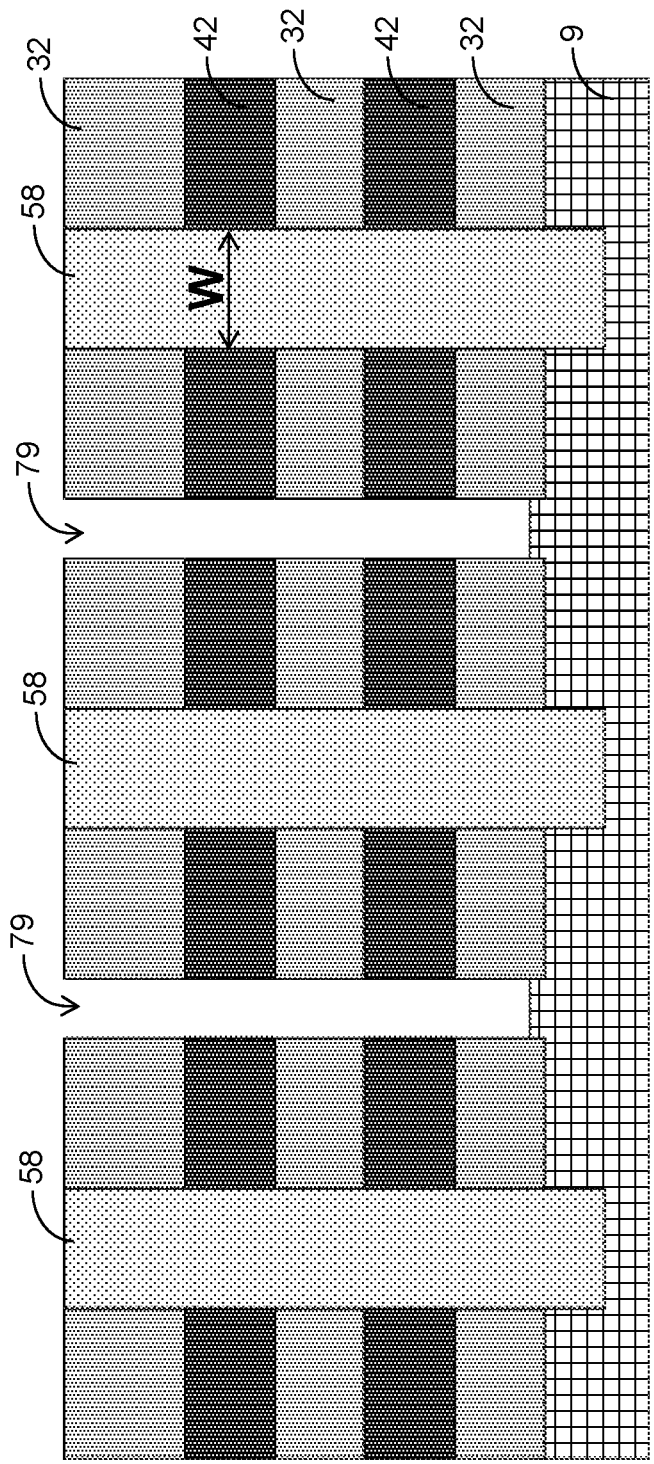
FIG. 14A is a schematic cross-sectional view of an exemplary structure prior to etching.
Figure 14B:
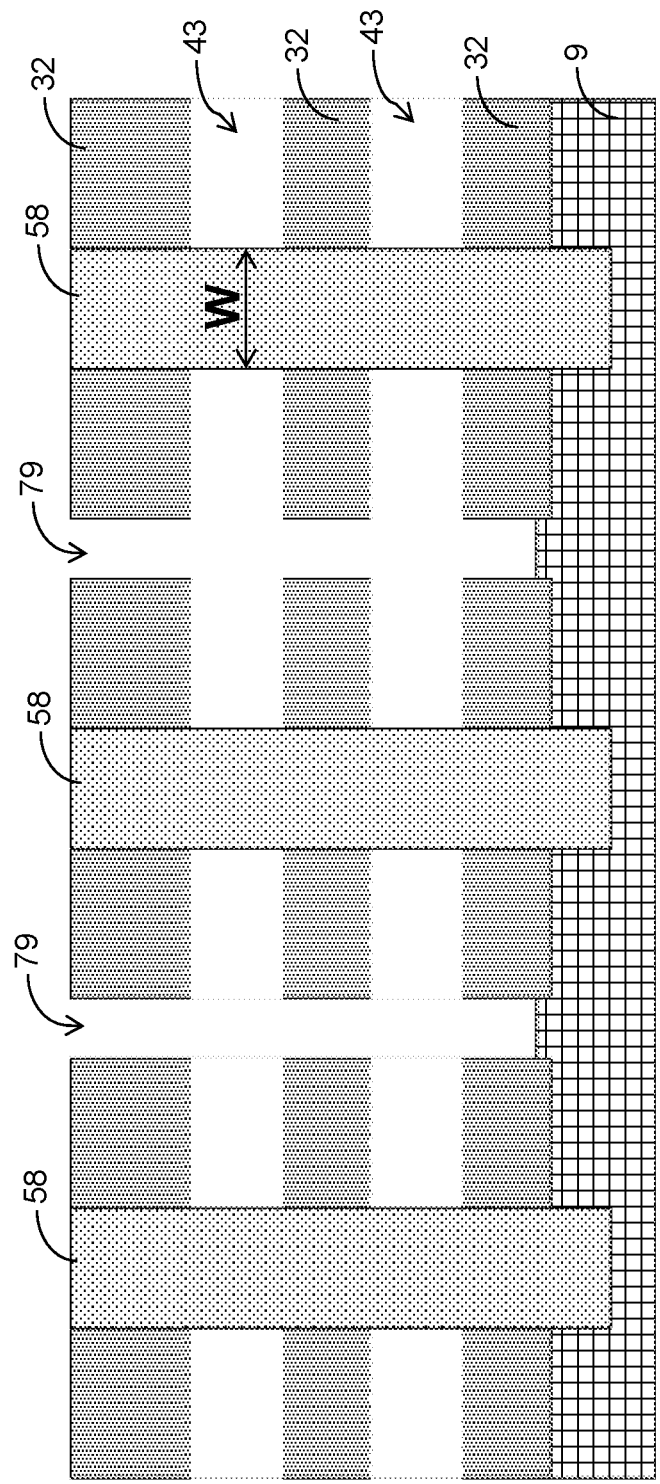
FIG. 14B is a schematic cross-sectional view of the exemplary structure of FIG. 14A at an ideal etch end point.
Figure 14C:
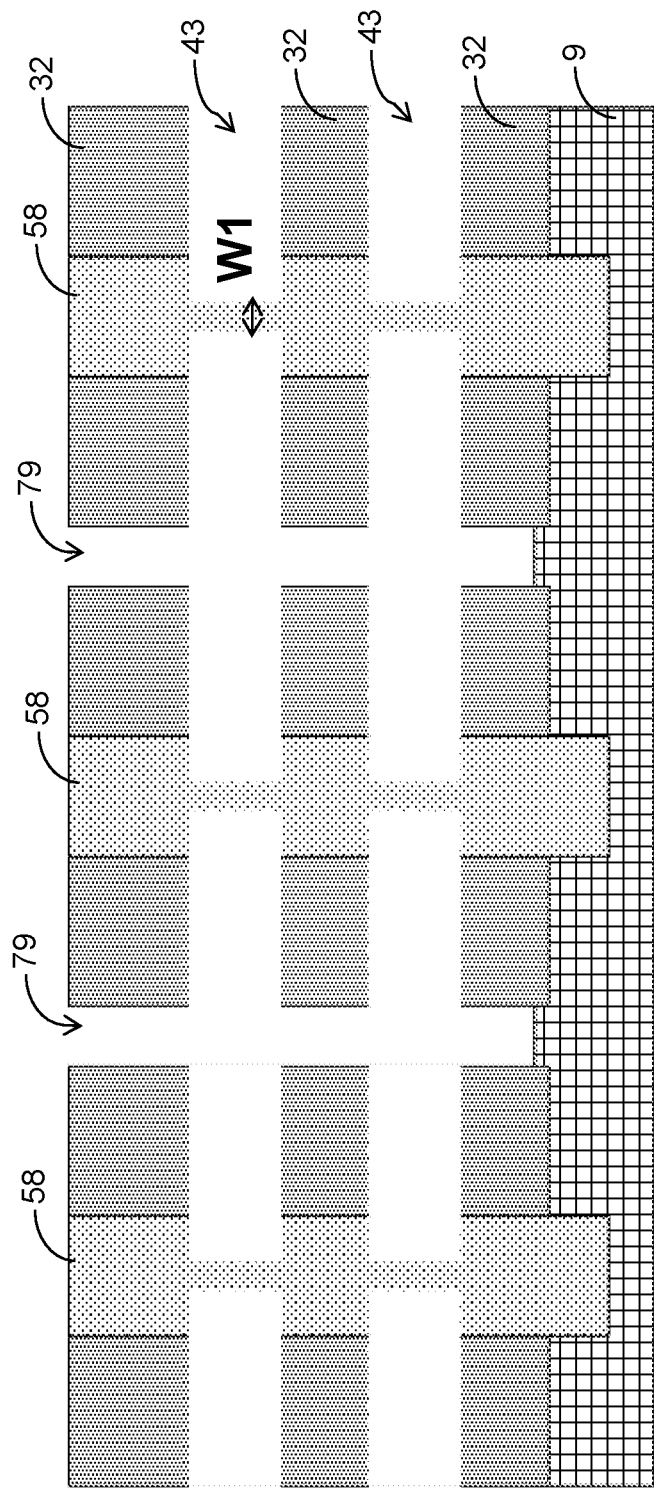
FIG. 14C is a schematic cross-sectional view of the exemplary structure of FIG. 14A after over etching.

FIGS. 14A, 14B, and 14C illustrate an exemplary three-dimensional memory device at three different etch points, specifically prior to etching (FIG. 14A), at a desired etching end point using a weight measurement of an embodiment (FIG. 14B), and after over etching into the blocking dielectric using a comparative method which uses a densimeter (FIG. 14C). The three-dimensional memory device illustrated in FIGS. 14A, 14B, and 14C is a simplified rendering of the various devices discussed with reference to FIGS. 1-13B, such as the in-process device shown in FIGS. 8 and 9A.

As discussed above and as shown in FIG. 14A, prior to etching, the three-dimensional memory device may include a substrate 9, 10 supporting the sacrificial material layers 42, insulating layers 32, memory opening fill structures 58 and backside trenches 79. Prior to etching, the memory opening fill structures 58 may have a width 'W'.

Ideally, the width 'W' will not change during the etching process until silicon nitride sacrificial material layers 42 of the three-dimensional memory device are etched to a selected end point illustrated in FIG. 14B (i.e., without etching the backside recesses 43 into the blocking dielectric 52). The selected end point may be the point at which all the silicon nitride layers 42 are completely etched away forming the backside recesses 43 in the three-dimensional memory device, but without significantly etching the exposed blocking dielectric 52 (i.e., by etching less than 1 nm thickness, such as 0 to 0.5 nm of the blocking dielectric) exposed in the backside recesses 43. The end point may be detected by measuring the weight of the phosphoric acid solution, as will be described in more detail below with respect to FIG. 15.

In contrast, as shown in FIG. 14C, if a densimeter of the comparative example is used to detect the etching end point, then the measurement may not be sufficiently accurate or may take too long, such that the over etching occurs into the blocking dielectric 52 exposed on the backside recesses 43. Over 1 nm thickness of the blocking electric 52 may occur during the over etching. The over etching reduces the width (e.g., diameter) of the memory opening fill structures 58 to a width 'W1' less than the width 'W' by reducing the width of the memory film 50 portion of the memory opening fill structures 58. Such over etching damages the blocking dielectric 52 and causes non-uniformity in the memory film 50, which may degrade the threshold voltage distribution and uniformity of the memory device.

Thus, various embodiments provide methods and apparatus for controlling a phosphoric acid wet etch end point detection process by measuring the weight of the circulating phosphoric acid etching solution, which contains phosphoric acid, water (e.g., deionized water) and silicon containing by products of the silicon nitride etching. Various embodiments may provide improved silicon concentration measurement precision and may control a phosphoric acid wet etch process based on the silicon concentration in the solution measured from the weight of the solution.

Figure 15:
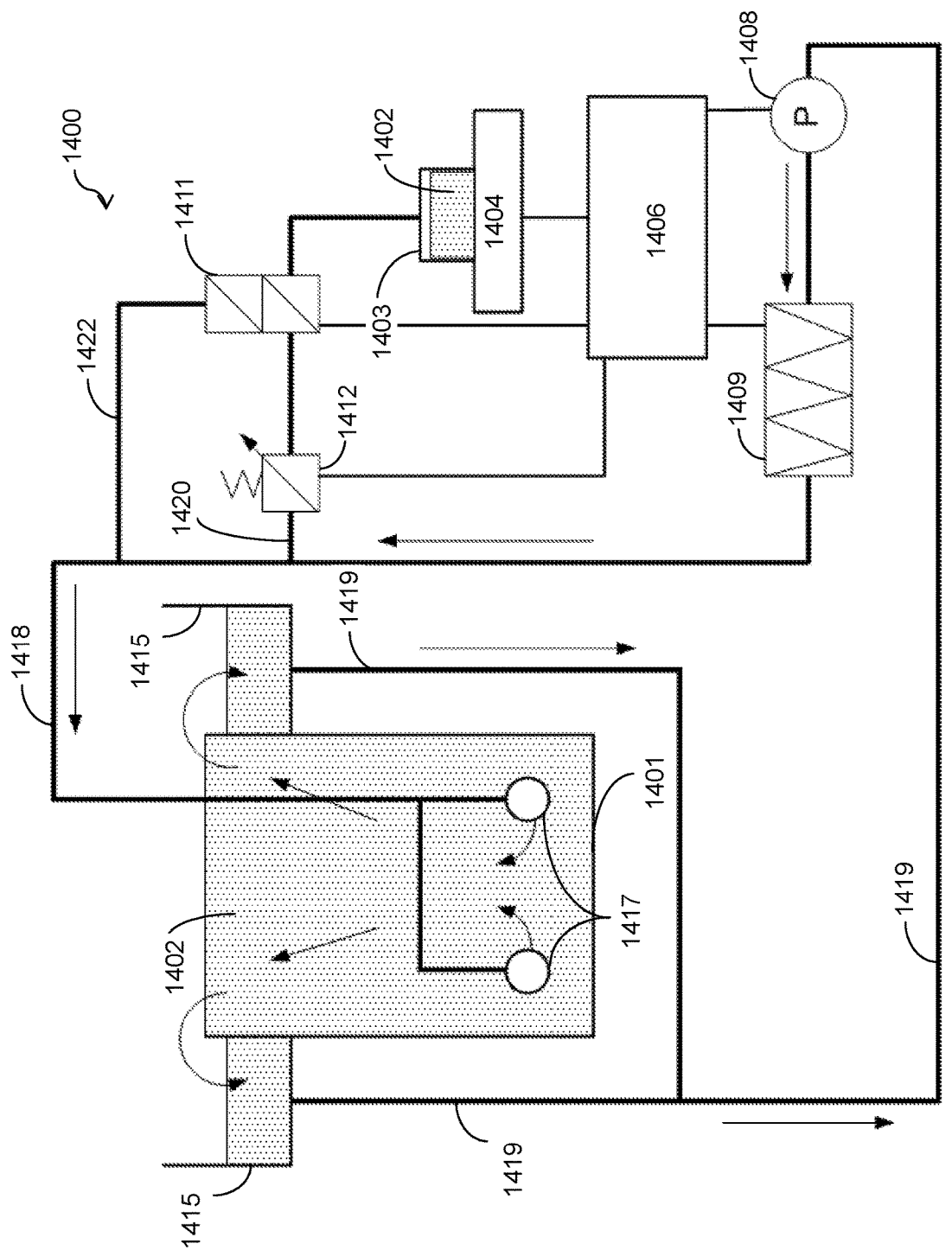
FIG. 15 is a component block diagram of an embodiment etching system.

In a phosphoric acid wet etch process, a semiconductor device, such as the above described three-dimensional memory device or another semiconductor device, may be placed in an etching apparatus, such as the embodiment etching system 1400 illustrated in FIG. 15. The etching system 1400 may include a tank having a main portion 1401 and overflow portions 1415. The semiconductor device to be etched may be placed in the main portion 1401 and phosphoric acid solution 1402 may be circulated through the etching system 1400 to etch the device. For example, a fixed volume of phosphoric acid solution 1402, such as 20 to 100 liters (L) e.g., about 40 L, 50 L, 60 L, etc., may be circulated through the etching system 1400. The phosphoric acid solution 1402 may be pumped through the circulation piping of the etching system 1400 by a pump 1408. A series of one or more drain lines 1419 may receive phosphoric acid solution 1402 from the overflow portions 1415 of the tank, and the pump 1408 may draw the phosphoric acid solution 1402 through the drain lines 1419 to and into one or more supply lines 1418 that may outlet into the main portion 1401 of the tank via one or more nozzles 1417. The pump 1408 may force the phosphoric acid solution 1402 through the supply lines 1418. One or more heaters 1409 may be included along the supply lines 1418 to heat the phosphoric acid solution 1402. The operation of the heater 1409 and pump 1408 may be controlled by a controller 1406 connected to the heater 1409 and pump 1408 using a wired or wireless data connection. The controller 1406 may be any type controller (e.g., a computer or dedicated control logic device or circuit, etc.). In various aspects, the controller 1406 may include one or more processors configured with processor-executable instructions to perform operations to monitor and control the state of the etching system 1400 and a three-dimensional memory device being etching, as well as perform operations to determine silicon concentrations as described herein.

As the phosphoric acid solution 1402 is circulated past the semiconductor device being etched, such as the three-dimensional memory device, and etches the silicon nitride layer or layers, such as the sacrificial material layers, the concentration of silicon or silicon containing compound (e.g., silicon hydroxide) etch product in the phosphoric acid solution 1402 will increase. The concentration of silicon or silicon containing compound in the phosphoric acid solution 1402 that is removed from the drain line or lines 1419 may be related to the amount of etching of the silicon nitride layer or layers that has occurred. The silicon or silicon containing compound generated by etching of the silicon nitride is provided into the phosphoric acid solution in the drain line(s) 1419 and thus increase the weight of the solution over time for a given volume of the solution. The weight of the solution may be used to determine the end point of the silicon nitride etching either directly via a look up table or indirectly by determining the silicon concentration in the solution from the weight of the solution and then determining the end point of the silicon nitride etching from the determined silicon concentration in the solution.

To determine the weight of the solution, in various embodiments, a sample line 1420 may be connected to the supply lines or lines 1418 (if the system is a closed system which recycles the phosphoric acid solution from the drain line(s) 1419 into the supply line(s)) and/or to the drain line or lines 1419 in a closed system or an open system. For example, in a closed system, the sample line 1420 may divert a portion of the flow of phosphoric acid solution 1402 from the supply lines 1418 to a sample container 1403. The diverted portion of the phosphoric acid solution 1402 may be at the operating temperature of the etching system 1400 (e.g., at a temperature between 140 and 180° C.). The sample container 1403 may be configured such that the sample of phosphoric acid solution 1402 in the sample container 1403 may not need to cool from the operating temperature at which etching is occurring in the system 1400. The flow of phosphoric acid solution 1402 through the sample line 1420 to the sample container 1403 may be controlled by valves, such as valve 1411. For example, valve 1411 may be a magnetic valve with a controllable flow rate. The valve 1411 may be connected via a wired or wireless data connection to the controller 1406. The quantity of phosphoric acid solution 1402 sent to the sample container 1403 may be managed strictly by a flow meter 1412, such as an integral calculus flow meter, connected via a wired or wireless data connection to the controller 1406. The valve 1411 may be opened to provide a fixed quantity, such as a set sample volume, of phosphoric acid solution 1402 from the sample line 1420 to the sample container 1403. Once that fixed quantity is sent to the sample container 1403, the valve 1411 may be shifted (e.g., closed or otherwise changed in position) to prevent further flow of phosphoric acid solution 1402 to the sample container 1403. For example, the valve 1411 may divert phosphoric acid solution 1402 from the sample line 1420 to a back flow line 1422 leading back to the supply lines 1418.

The sample container 1403 may be supported on a scale 1404 connected via a wired or wireless data connection to the controller 1406. As an example, the scale 1404 may be an electro balance type scale, such as a UW series scale from the Shimadu Corporation. The scale 1404 may be any type scale with a suitable resolution, such as a resolution of greater than 0.01 grams, such as 0.005 to 0.001 grams (g). The scale may be pre-tared such that the weight of the empty sample container 1403 is accounted for, or the weight of the empty sample container 1403 itself may be known by the controller 1406. Once the sample container 1403 is filled to include the fixed quantity, such as a set sample volume, of phosphoric acid solution 1402, then the phosphoric acid solution 1402 in the sample container 1403 may be weighed. The weighing of the fixed quantity of phosphoric acid solution 1402 in the sample container 1403 may occur at the operating temperature at which etching is occurring in the system 1400. In this manner, no cooling of the phosphoric acid solution 1402 being sampled may be needed.

In various embodiments, the amount of silicon or silicon compound in the phosphoric acid solution 1402 may be known value that corresponds to the amount of silicon nitride etched from the semiconductor device. Thus, the amount of silicon or silicon compound present in the phosphoric acid solution may also be calculated when the etching end point is reached. Therefore, to calculate the etching end point, the weight of the phosphoric acid solution 1402 in the sample container 1403 is determined by the scale 1404.

In a first embodiment, the concentration of silicon or silicon compound in the phosphoric acid solution 1402 may be calculated from the weight of the predetermined volume of the phosphoric acid solution 1402 in the sample container 1403. For example, the concentration of silicon or silicon compound in the phosphoric acid solution 1402 will increase generally linearly with the weight of the predetermined volume of the phosphoric acid solution 1402. In this first embodiment, the concentration of silicon or silicon compound in the phosphoric acid solution 1402 may be calculated from the weight of the predetermined volume of the phosphoric acid solution 1402 using a formula, a predetermined look up table or a graph of concentration versus weight.

Once the concentration of silicon or silicon compound in the phosphoric acid solution 1402 is determined, the controller 1406 may determine whether to continue the etch or to stop the etch when the end point is reached when the concentration of silicon or silicon compound in the phosphoric acid solution 1402 reaches a predetermined threshold value. The semiconductor device may be removed from the main portion 1401 of the tank and the pump 1408 may be stopped when the concentration of silicon or silicon compound in the phosphoric acid solution 1402 reaches the predetermined threshold value indicative of the etching end point.

In a second embodiment, the etching end point is determined from the weight of the phosphoric acid solution 1402 without determining the concentration of silicon or silicon compound in the phosphoric acid solution 1402 the sample container 1403. In this embodiment, a look up table is constructed using experimental or calculated weight values which includes a threshold value of the weight which corresponds to the weight of the predetermined volume of the phosphoric acid solution at the etching end point. The threshold value of the weight in the look up table may be calculated from the silicon or silicon compound concentration described in the prior embodiment. The look up table is stored in the controller 1406 or in an external memory accessible by the controller 1406. In this embodiment, the weight of the predetermined volume of the phosphoric acid solution 1402 in the sample container 1403 is measured and then compared to the value or values in the look up table. If the weight is below the threshold value in the look up table, then the etching continues. If the weight is equal to or greater than the threshold value, then the etching is stopped. In this manner, over etching may be avoided.

In various embodiments, the time to take the sample, weigh the sample, optionally determine the silicon concentration in the sample, and determine whether to stop etching based on the silicon concentration may take between about 30 to 60 seconds. When the resolution of the scale 1404 is 0.001 g, the scale 1404 may impart a silicon concentration detection accuracy of +/−0.01 ppm to the system 1400.

Figure 16:
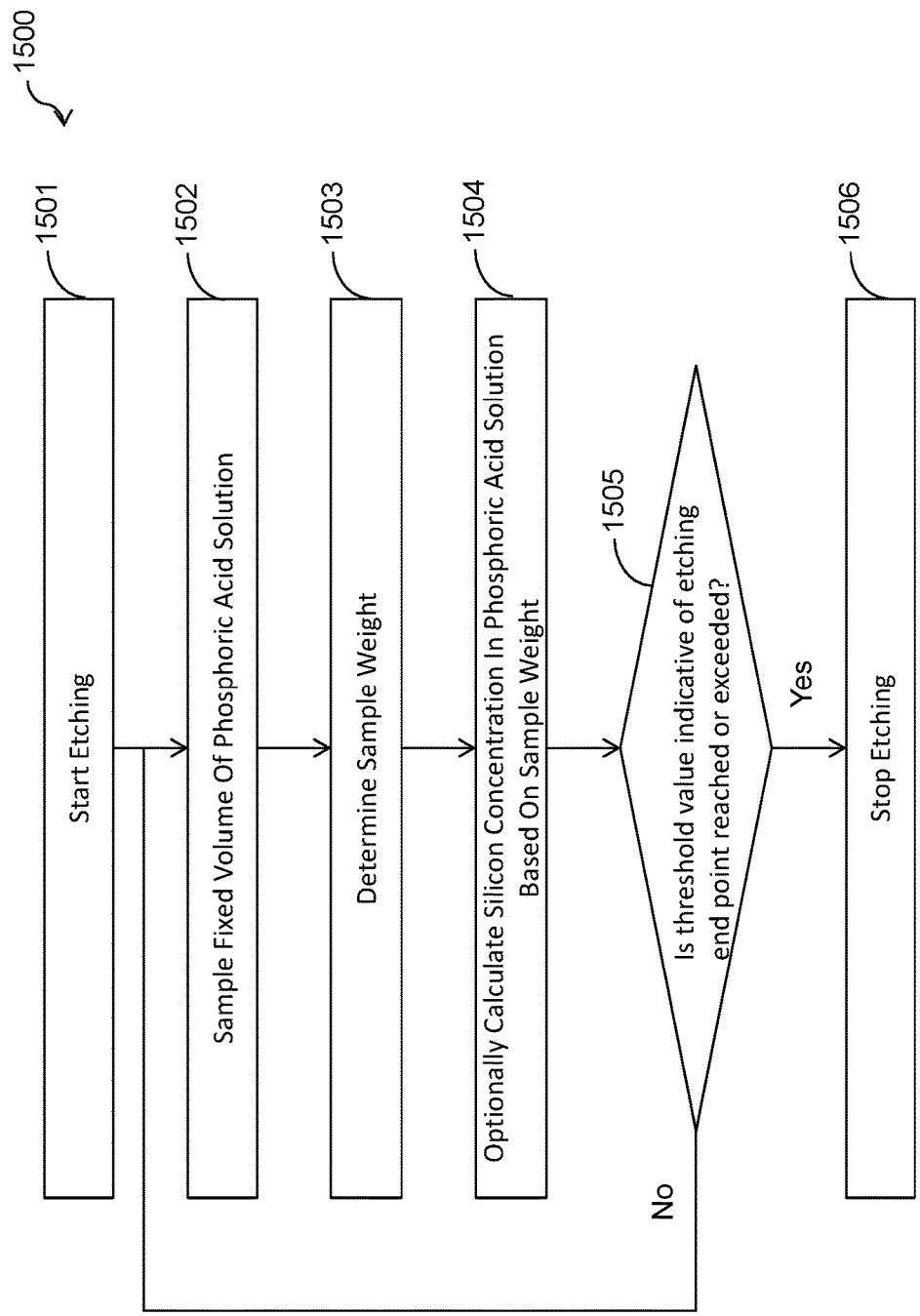
FIG. 16 is a process flow diagram illustrating an embodiment method for etching control.

FIG. 16 illustrates an embodiment method 1500 for etching control. In some embodiments, the operations of method 1500 may be performed using an etching system, such as etching system 1400. In some embodiments, the operations of method 1500 may be performed by a controller monitoring an etching system, such as controller 1406. The operations of method 1500 may provide direct measurement methods to detect a desired etch stop point.

In block 1501, etching may be started. For example, a semiconductor device to be etched may be placed in a tank and phosphoric acid may be circulated through the tank of the etching system to etch the device by removing one or more silicon nitride layers.

In block 1502, a fixed volume of phosphoric acid solution may be sampled from the etching system. For example, a sample line may be controlled to fill a sample container with a selected (e.g., predetermined) volume of phosphoric acid solution, such as 100 cc.

In block 1503, the weight of the sample may be determined. For example, an electro balance scale 1404 may determine the weight of the sample of the selected volume of phosphoric acid solution.

In optional block 1504, the silicon concentration in the phosphoric acid solution may be calculated based on the sample weight as described in the first embodiment above. Alternatively, this step may be omitted in the second embodiment described above.

In determination block 1505, a threshold value indicative of the etching end point has been reached or exceeded is determined. In the first embodiment, whether the silicon or silicon compound concentration is at or above a threshold concentration value indicative of etching end point may be determined. The threshold may be a silicon concentration value that is selected to correspond to an amount of etching of silicon nitride that is desired, i.e., a selected etch end point.

In the second embodiment, the weight measured by the scale 1404 (i.e., weight of the phosphoric acid solution 1402 or the combined weight of the phosphoric acid solution 1402 and the sample container 1403) is compared to a look up table. In this second embodiment, whether the measured weight is at or above a threshold weight value in the look up table indicative of etching end point may be determined.

In response to determining that the above described threshold value indicative of the etching end point has not been reached or exceeded (i.e., determination block 1505="No") another sample may be taken in block 1502. In this manner, the phosphoric acid solution may be periodically sampled until the threshold value is reached or exceeded. In various embodiments, the measurement interval time may be about 30 to 60 seconds.

In response to determining the silicon concentration is at or above the threshold (i.e., determination block 1505="Yes"), etching may be stopped in block 1506. In this manner, over etching of the semiconductor device, such as the three-dimensional memory device may be avoided as etching may be ceased based on the measured weight of the phosphoric acid solution 1402. The use of the weight of the sample in method 1500 to determine silicon concentration may provide an etch process with a repeatability of +/−0.1 parts per million (ppm) and error rate of 0.2%.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

In alternative embodiments, the method described above with respect to FIG. 16 may be used to determine an etching end point in any suitable device, such as any suitable semiconductor device. Specifically, the method may be used to determine the end point of silicon nitride layer etching using a phosphoric acid solution in any suitable logic device (e.g., transistor or transistor array) or memory device (e.g., two-dimensional NAND memory device, a ReRAM device, a phase change memory device, an SRAM device, a DRAM device, etc.).

Thus, according to an aspect of the present disclosure described above with respect to FIG. 16, a method of making a device includes etching a silicon nitride layer 42 using phosphoric acid solution, filling a sample container 1403 with a fixed quantity of the phosphoric acid solution 1402 that was used to etch the silicon nitride layer 42, determining a weight of the sample container containing the fixed quantity of phosphoric acid solution, determining if a threshold value indicative of the etching end point has been reached or exceeded based on the determined weight, and stopping the etching of the silicon nitride layer 42 in response to determining that the threshold value indicative of the etching end point has been reached or exceeded.

In a first embodiment, the method further comprises determining a silicon concentration in the fixed quantity of phosphoric acid solution 402 based the determined weight of the sample container 403, and determining whether the silicon concentration is at or above a value of the silicon concentration corresponding to the threshold value indicative of the etching end point. In the first embodiment, determining the silicon concentration comprises determining a portion of the determined weight attributed to silicon resulting from etching the silicon nitride layer, and determining the silicon concentration based on a parts per million of weight of silicon and the portion of the determined weight attributed to silicon resulting from etching the silicon nitride layer.

In a second embodiment, the determining if the threshold value indicative of the etching end point has been reached or exceeded based on the determined weight comprises comparing the determined weight of the sample container to a stored value of a weight corresponding to the threshold value indicative of the etching end point, and determining if the determined weight is equal to or exceeds the stored value of the weight corresponding to the threshold value indicative of the etching end point.

In one embodiment, the fixed quantity of phosphoric acid solution in the sample container is at a temperature above 100° C. used to etch the silicon nitride layer 42. In one embodiment shown in FIG. 15, the method further comprises providing at least a portion of the phosphoric acid solution used to etch the silicon nitride layer from a main portion 1401 of a tank containing the silicon nitride layer 42 over a substrate (9, 10) to at least one overflow portion 1415 of the tank, and providing at least a first portion of the phosphoric acid solution from the at least one overflow portion 1415 of the tank into the sample container 1403. The method further comprises recycling a second portion of the phosphoric acid solution from the at least one overflow portion 1415 of the tank into the main portion 1401 of the tank through lines 1419 and 1418 using a pump 1408.

Figure 11C:
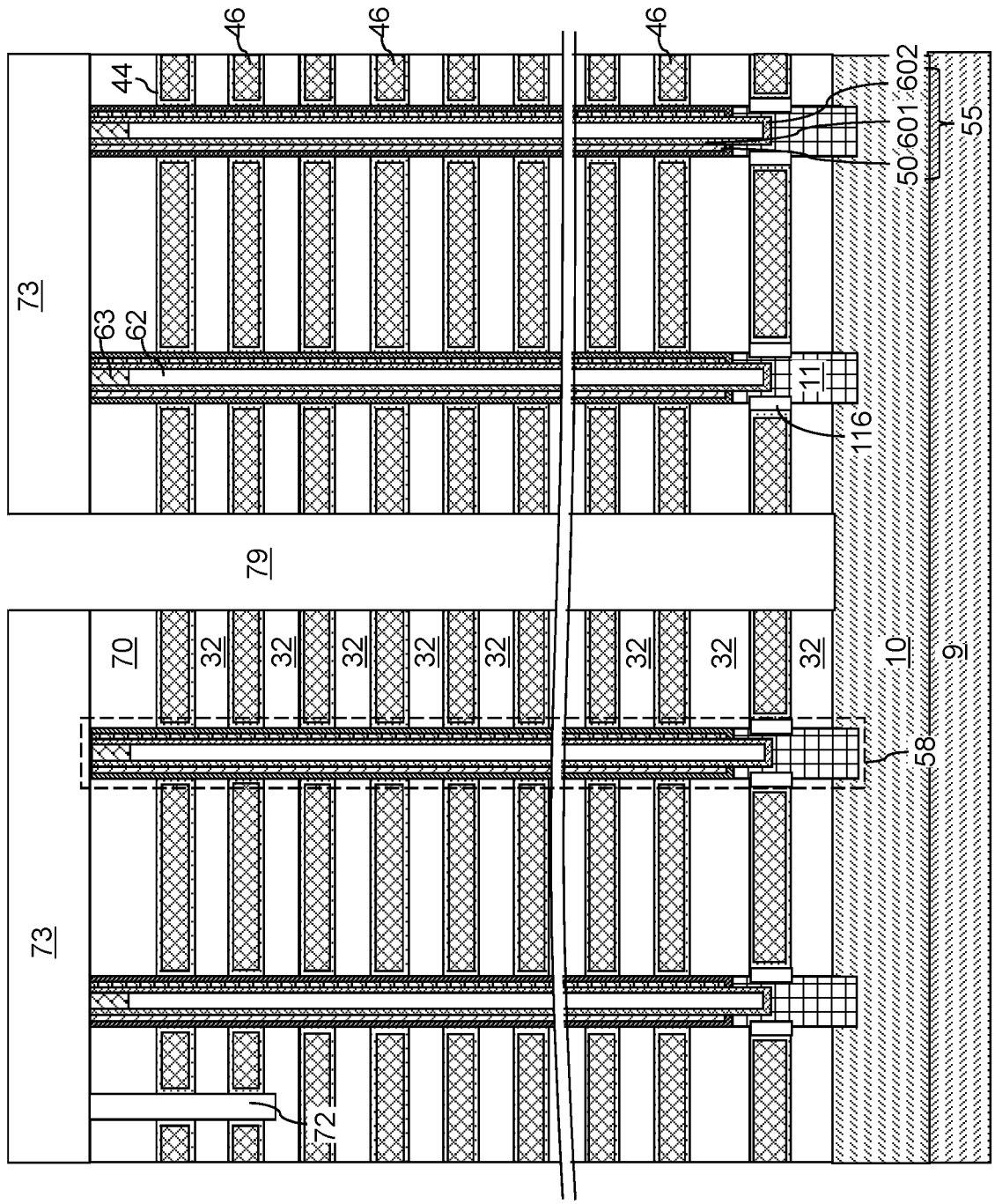
FIG. 11C is a vertical cross-sectional view of the exemplary structure along the vertical plane C-C' of FIG. 11B.

In one embodiment, the device comprises a three dimensional memory device and the silicon nitride layer 42 is located over a substrate (9, 10) in an alternating stack of insulating layers 32 and silicon nitride sacrificial layers 42. The method further comprises forming memory stack structures 55 containing a vertical semiconductor channel 60 and memory film 50 in the alternating stack as shown in FIG. 6, forming a trench 79 through the alternating stack as shown in FIGS. 7A and 7B, selectively etching the silicon nitride sacrificial layers 42 through the trench using a phosphoric acid solution, filling a sample container 403 with a fixed quantity of the phosphoric acid solution 402 that was used to etch the silicon nitride sacrificial layers 42 determining a weight of the sample container, determining if a threshold value indicative of the etching end point has been reached or exceeded based on the determined weight, stopping the etching of the silicon nitride sacrificial layers in response to determining that the threshold value indicative of the etching end point has been reached or exceeded to leave recesses 43 between the insulating layers 32, as shown in FIG. 8, and filling the recesses with electrically conductive layers as shown in FIGS. 10 to 11C.

According to an embodiment illustrated in FIG. 15, a phosphoric acid wet etching system includes an etch tank (1401, 1415), a sample line 1420 configured to fill a sample container 1403 with a fixed quantity of phosphoric acid solution 1402 being used to etch a silicon nitride layer in the etch tank, a scale 1404 configured to a determine a weight of the sample container containing the fixed quantity of phosphoric acid, and a controller 1405 connected via a wired or wireless connection to the scale 1404. The controller is configured to determine if a threshold value indicative of the etching end point has been reached or exceeded based on the determined weight, and stop the etching of the silicon nitride layer in response to determining that the threshold value indicative of the etching end point has been reached or exceeded.

Control elements or controllers may be implemented using computing devices (such as computer) comprising processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of making a device, comprising:
   etching a silicon nitride layer using phosphoric acid solution;
   filling a sample container with a fixed quantity of the phosphoric acid solution that was used to etch the silicon nitride layer;
   determining a weight of the sample container containing the fixed quantity of phosphoric acid solution;
   determining if a threshold value indicative of the etching end point has been reached or exceeded based on the determined weight; and
   stopping the etching of the silicon nitride layer in response to determining that the threshold value indicative of the etching end point has been reached or exceeded.

2. The method of claim 1, further comprising:
   determining a silicon concentration in the fixed quantity of phosphoric acid solution based the determined weight; and
   determining whether the silicon concentration is at or above a value of the silicon concentration corresponding to the threshold value indicative of the etching end point.

3. The method of claim 2, wherein determining the silicon concentration comprises:
   determining a portion of the determined weight attributed to silicon resulting from etching the silicon nitride layer; and
   determining the silicon concentration based on a parts per million of weight of silicon and the portion of the determined weight attributed to silicon resulting from etching the silicon nitride layer.

4. The method of claim 1, wherein the determining if the threshold value indicative of the etching end point has been reached or exceeded based on the determined weight comprises:
   comparing the determined weight to a stored value of a weight corresponding to the threshold value indicative of the etching end point; and
   determining if the determined weight is equal to or exceeds the stored value of the weight corresponding to the threshold value indicative of the etching end point.

5. The method of claim 1, wherein the fixed quantity of phosphoric acid solution in the sample container is at a temperature above 100° C. used to etch the silicon nitride layer.

6. The method of claim 1, further comprising:
   providing at least a portion of the phosphoric acid solution used to etch the silicon nitride layer from a main portion of a tank containing the silicon nitride layer over a substrate to at least one overflow portion of the tank; and
   providing at least a first portion of the phosphoric acid solution from the at least one overflow portion of the tank into the sample container.

7. The method of claim 6, further comprising recycling a second portion of the phosphoric acid solution from the at least one overflow portion of the tank into the main portion of the tank using a pump.

8. A phosphoric acid wet etching system, comprising:
   an etch tank;
   a sample line configured to fill a sample container with a fixed quantity of phosphoric acid solution being used to etch a silicon nitride layer in the etch tank;
   a scale configured to a determine a weight of the sample container containing the fixed quantity of phosphoric acid solution; and
   a controller connected to the scale, the controller configured to:
     determine if a threshold value indicative of the etching end point has been reached or exceeded based on the determined weight; and
     stop the etching of the silicon nitride layer in response to determining that the threshold value indicative of the etching end point has been reached or exceeded.

9. The system of claim 8, wherein the controller is further configured to:
   determine a silicon concentration in the fixed quantity of phosphoric acid solution based the determined weight; and
   determine whether the silicon concentration is at or above a value of the silicon concentration corresponding to the threshold value indicative of the etching end point.

10. The system of claim 9, wherein the controller is configured to determine the silicon concentration by:

determining a portion of the determined weight attributed to silicon resulting from etching the silicon nitride layer; and determining the silicon concentration based on a parts per million of weight of silicon and the portion of the determined weight attributed to silicon resulting from etching the silicon nitride layer.

11. The system of claim 8, wherein the controller is further configured to:

compare the determined weight to a stored value of a weight corresponding to the threshold value indicative of the etching end point; and determining if the determined weight is equal to or exceeds the stored value of the weight corresponding to the threshold value indicative of the etching end point.

12. The system of claim 8, wherein the scale is an electro balance scale.

* * * * *